United States Patent
Yasuda

(10) Patent No.: US 10,580,786 B2
(45) Date of Patent: Mar. 3, 2020

(54) SEMICONDUCTOR MEMORY DEVICE AND METHOD FOR MANUFACTURING THE SAME

(71) Applicant: Toshiba Memory Corporation, Minato-ku (JP)

(72) Inventor: Naoki Yasuda, Mie (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/967,930

(22) Filed: May 1, 2018

(65) Prior Publication Data
US 2018/0254279 A1 Sep. 6, 2018

Related U.S. Application Data

(60) Division of application No. 15/343,591, filed on Nov. 4, 2016, now Pat. No. 9,991,274, which is a
(Continued)

(51) Int. Cl.
*H01L 21/02* (2006.01)
*H01L 27/1157* (2017.01)
(Continued)

(52) U.S. Cl.
CPC ...... *H01L 27/1157* (2013.01); *H01L 21/0214* (2013.01); *H01L 21/0217* (2013.01);
(Continued)

(58) Field of Classification Search
CPC ......... H01L 27/11582; H01L 27/11565; H01L 21/0223; H01L 21/02164; H01L 29/511;
(Continued)

(56) References Cited

U.S. PATENT DOCUMENTS 7,821,058 B2 * 10/2010 Kidoh ............... H01L 27/11568
257/324
7,983,084 B2 * 7/2011 Tokiwa ............... G11C 16/0483
365/185.06

(Continued)

*Primary Examiner* — Jarrett J Stark
(74) *Attorney, Agent, or Firm* — Oblon, McClelland, Maier & Neustadt, L.L.P.

(57) ABSTRACT

According to one embodiment, a semiconductor memory device includes a stacked body including a plurality of electrode members and a plurality of insulating members, each of the electrode members and each of the insulating members being stacked alternately in a first direction on the substrate. The semiconductor memory device also includes a memory hole that extends in the stacked body in the first direction and a semiconductor member that is disposed to extend in the memory hole in the first direction. The semiconductor memory device also includes a memory member that is disposed between the semiconductor member and the plurality of electrode members. The plurality of electrode members including a first electrode member and a second electrode member, a thickness of the memory member at the position of the first electrode member being greater than a thickness of the memory member at the position of the second electrode member.

7 Claims, 19 Drawing Sheets

Related U.S. Application Data continuation of application No. 14/645,682, filed on Mar. 12, 2015, now Pat. No. 9,508,739.

(60) Provisional application No. 62/049,226, filed on Sep. 11, 2014.

(51) Int. Cl.
*H01L 27/11582* (2017.01)
*H01L 29/51* (2006.01)
*H01L 21/28* (2006.01)
*H01L 27/11565* (2017.01)
*H01L 29/10* (2006.01)
*H01L 29/423* (2006.01)

(52) U.S. Cl.
CPC .... *H01L 21/0223* (2013.01); *H01L 21/02164* (2013.01); *H01L 21/02326* (2013.01); *H01L 27/11565* (2013.01); *H01L 27/11582* (2013.01); *H01L 29/1037* (2013.01); *H01L 29/40117* (2019.08); *H01L 29/4234* (2013.01); *H01L 29/511* (2013.01); *H01L 29/518* (2013.01); *H01L 21/02252* (2013.01); *H01L 21/02255* (2013.01)

(58) Field of Classification Search
CPC ........... H01L 21/28282; H01L 21/0214; H01L 21/02255; H01L 21/02252; H01L 27/1157; H01L 21/02326; H01L 27/115–11597; H01L 2924/1451; H01L 29/42324–42336; H01L 29/788–7889; H01L 27/11524; H01L 27/11529; H01L 27/11551–11556; H01L 29/4234–42352; H01L 29/518; H01L 29/792–7926; H01L 27/11578–11582; G11C 16/00–349; G11C 2216/06–10
See application file for complete search history.

(56) References Cited

U.S. PATENT DOCUMENTS

| | | | |
|---|---|---|---|
| 8,441,061 B2 | 5/2013 | Nakao et al. | |
| 8,643,081 B2* | 2/2014 | Fujiwara | H01L 29/792 257/321 |
| 8,735,965 B2* | 5/2014 | Ishihara | H01L 29/66833 257/324 |
| 8,902,661 B1* | 12/2014 | Raghu | G11C 16/10 365/185.05 |
| 9,166,032 B1* | 10/2015 | Higuchi | H01L 21/0262 |
| 2004/0124466 A1* | 7/2004 | Walker | H01L 27/115 257/344 |
| 2004/0125629 A1* | 7/2004 | Scheuerlein | G11C 16/0483 365/17 |
| 2004/0140510 A1* | 7/2004 | Hazama | H01L 27/115 257/390 |
| 2004/0145024 A1* | 7/2004 | Chen | G11C 16/0483 257/390 |
| 2004/0232496 A1* | 11/2004 | Chen | H01L 21/7682 257/390 |
| 2007/0252201 A1* | 11/2007 | Kito | H01L 21/8221 257/331 |
| 2009/0090965 A1* | 4/2009 | Kito | H01L 21/8221 257/326 |
| 2009/0108333 A1* | 4/2009 | Kito | H01L 27/115 257/324 |
| 2009/0146206 A1* | 6/2009 | Fukuzumi | H01L 21/8221 257/324 |
| 2009/0224309 A1* | 9/2009 | Kidoh | H01L 21/8221 257/326 |
| 2009/0230458 A1* | 9/2009 | Ishiduki | H01L 27/11565 257/324 |
| 2009/0294844 A1* | 12/2009 | Tanaka | H01L 21/28282 257/330 |
| 2010/0072538 A1* | 3/2010 | Kito | H01L 27/11578 257/326 |
| 2010/0117137 A1* | 5/2010 | Fukuzumi | H01L 21/28282 257/324 |
| 2010/0123202 A1* | 5/2010 | Hofmann | H01L 21/8221 257/401 |
| 2010/0213537 A1* | 8/2010 | Fukuzumi | H01L 27/11578 257/326 |
| 2010/0237402 A1* | 9/2010 | Sekine | H01L 27/11551 257/324 |
| 2010/0322011 A1* | 12/2010 | Edahiro | G11C 11/5642 365/185.23 |
| 2011/0018052 A1 | 1/2011 | Fujiwara et al. | |
| 2011/0049607 A1* | 3/2011 | Yahashi | H01L 27/11578 257/324 |
| 2011/0049608 A1* | 3/2011 | Kidoh | H01L 27/11578 257/324 |
| 2011/0147823 A1* | 6/2011 | Kuk | H01L 27/11551 257/324 |
| 2013/0062685 A1* | 3/2013 | Yasuda | H01L 21/28282 257/325 |
| 2016/0079271 A1* | 3/2016 | Yasuda | H01L 21/28282 257/325 |

* cited by examiner

SEMICONDUCTOR MEMORY DEVICE AND METHOD FOR MANUFACTURING THE SAME

CROSS-REFERENCE TO RELATED APPLICATIONS

This application is a divisional of U.S. application Ser. No. 15/343,591, filed Nov. 4, 2016, which is a continuation of U.S. application Ser. No. 14/645,682 (now U.S. Pat. No. 9,508,739), filed Mar. 12, 2015, which is based upon and claims the benefit of priority from U.S. Provisional Patent Application 62/049,226, filed on Sep. 11, 2014; the entire contents of which are incorporated herein by reference.

FIELD

Embodiments described herein relate generally to a semiconductor memory device and a method for manufacturing the same.

BACKGROUND

Recently, there has been a trend toward high integration of a semiconductor memory device and thereby a stacked semiconductor memory device has been proposed. In a stacked semiconductor memory device, a stacked body in which word lines and interlayer insulating members are stacked alternately and a memory hole that penetrates through the stacked body are formed and a memory member is provided on a side surface of the memory hole. The memory member is formed to have a block insulating member, a charge storage member, and a tunnel insulating member, which are stacked from the outer side in this order. A silicon pillar and an insulation member are provided further on the center axis side from the memory member.

DETAILED DESCRIPTION

According to one embodiment, a semiconductor memory device includes a substrate. The semiconductor memory device also includes a stacked body including a plurality of electrode members and a plurality of insulating members, each of the electrode members and each of the insulating members being stacked alternately in a first direction on the substrate. The semiconductor memory device also includes a memory hole that extends in the stacked body in the first direction and a semiconductor member that is disposed to extend in the memory hole in the first direction. The semiconductor memory device also includes a memory member that is disposed between the semiconductor member and the plurality of electrode members. The plurality of electrode members including a first electrode member and a second electrode member, a diameter of the memory hole at a position of the first electrode member being smaller than a diameter of the memory hole at a position of the second electrode member, and a thickness of the memory member at the position of the first electrode member being greater than a thickness of the memory member at the position of the second electrode member.

According to one embodiment, a method for manufacturing a semiconductor memory device includes forming a first electrode member on a flat surface perpendicular to a first direction, forming a second electrode member parallel to the first electrode member, forming a memory hole that penetrates the first electrode member and the second electrode member in the first direction, forming a first insulating member on a side surface of the memory hole, and forming a second insulating member by oxidizing a surface of the first insulating member.

Hereinafter, embodiments of the invention will be described with reference to the drawings.

First Embodiment

First, a first embodiment is described.

Figure 1:
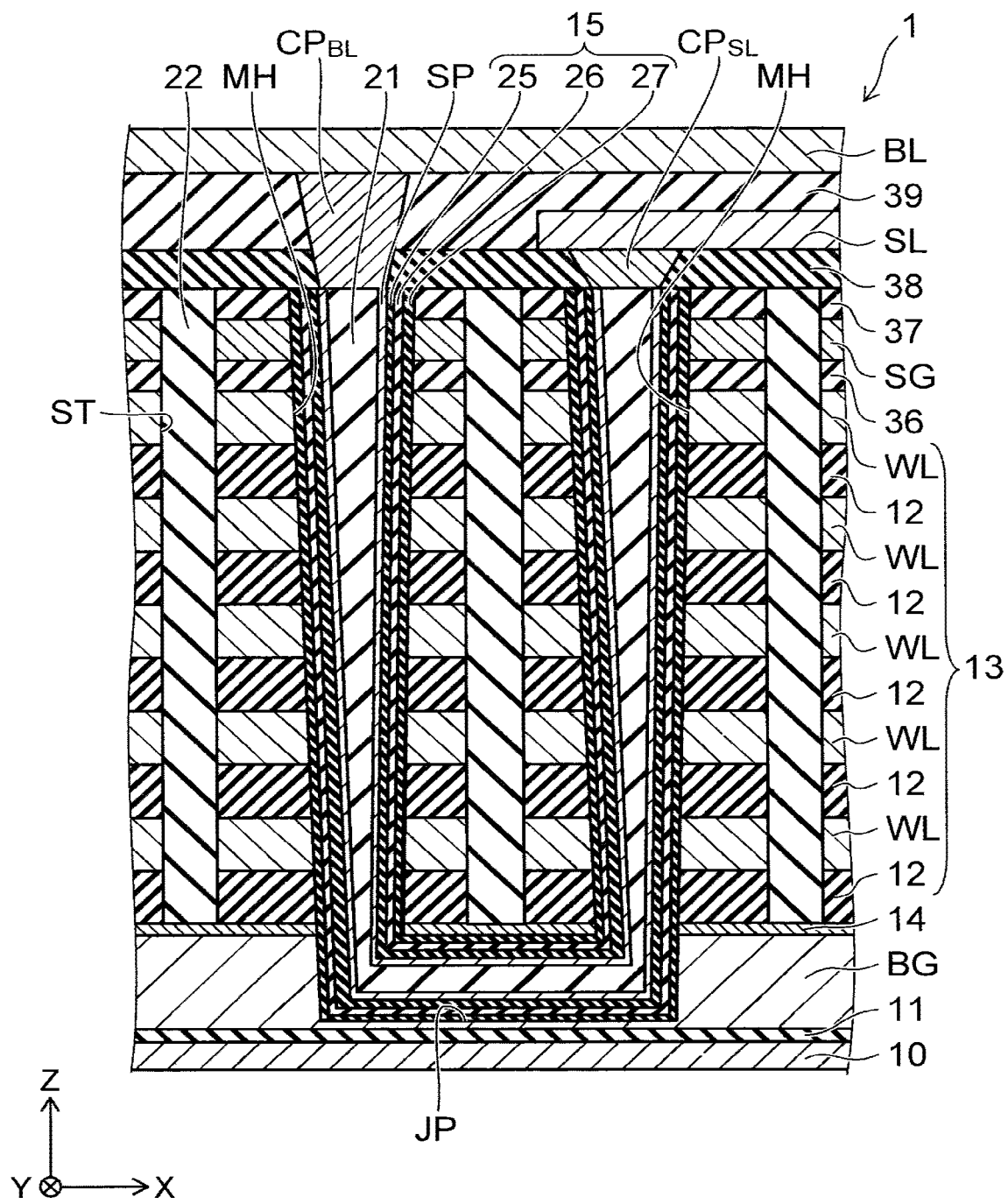
FIG. 1 is a cross-sectional view illustrating a semiconductor memory device according to a first embodiment.

FIG. 1 is a cross-sectional view illustrating a semiconductor memory device according to the embodiment.

The semiconductor memory device according to the embodiment is a stacked NAND flash memory.

As illustrated in FIG. 1, a silicon substrate 10 is provided in the semiconductor memory device 1 according to the embodiment and an insulating member 11 is provided on the silicon substrate 10.

Hereinafter, an XYZ Cartesian coordinate system is employed in the specification, for convenience of description. That is, in FIG. 1, two directions which are parallel to a contact surface between the silicon substrate 10 and the insulating member 11 and are orthogonal to each other correspond to "an X-direction" and a "Y-direction". In addition, an upward direction perpendicular to the contact surface between the silicon substrate 10 and the insulating member 11 corresponds to a "Z-direction". In descriptions below, when "upper section" and "lower section" are used, in the Z-direction, a portion which is further away from the silicon substrate 10 is referred to as the upper section and a portion which is closer to the silicon substrate 10 is referred to as the lower section.

A back-gate electrode BG, a stopper member 14, a stacked body 13, an interlayer insulating member 36, a selection-gate electrode SG, an interlayer insulating member 37, an interlayer insulating member 38, a source line SL, an interlayer insulating member 39, and a bit line BL are provided alternately on the insulating member 11 of the semiconductor memory device 1 from the lower section along the Z-direction.

A slit ST for separating word lines WL is formed on the stopper member 14 such that the slit ST penetrates through the stacked body 13 in the Z-direction. An insulating member 22 that is made of an insulating material is provided in the slit ST. The insulating member 22 extends in the Y-direction.

A memory hole MH is formed on the insulating member 11 such that the memory hole MH penetrates the stacked body from the interlayer insulating member 37 to the back-gate electrode BG in the Z-direction. Each end of a pair of memory holes MH is connected to a junction portion JP which is provided in the back-gate electrode BG and extends in the X-direction. The pair of memory holes MH and the junction portion JP form a U shape.

A memory member 15 is provided on side surfaces of the pair of memory holes MH and the junction portion JP. A silicon pillar SP is provided on a side surface of the memory member 15. An insulating member 21 is provided on the central axis side from the silicon pillar SP. The silicon pillar SP has a U shape. A memory cell is formed in a portion of the word line WL intersecting with the silicon pillar SP.

A contact plug $CP_{SL}$ that is embedded in the interlayer insulating member 38 is provided on one end of the U-shaped silicon pillar SP. A source line SL that is embedded in the interlayer insulating member 39 and extends in the Y-direction is provided on the contact plug $CP_{SL}$. A contact plug $CP_{BL}$ that is embedded in the interlayer insulating member 38 and interlayer insulating member 39 is provided on the other end of the silicon pillar SP. The bit line BL that extends in the X-direction is provided on the contact plug $CP_{BL}$ and the interlayer insulating member 39.

The memory member 15 is formed to have a block insulating member 27, a charge storage member 26, and a tunnel insulating member 25 which are stacked from the outer side in this order. The block insulating member 27 is formed of, for example, silicon oxide ($SiO_2$). The charge storage member 26 is formed of, for example, silicon nitride ($Si_3N_4$). The tunnel insulating member 25 is formed of silicon oxide obtained by oxidizing the charge storage member 26 that is formed of silicon nitride.

Normally, the tunnel insulating member 25 has insulation properties but a tunneling current flows through the member when a predetermined voltage within a range of drive voltages of the semiconductor memory device 1 is applied. In a case where the tunnel insulating member 25 is thin and, for example, the member thickness is 4 nm or less, a direct tunneling current flows through the member. The charge storage member 26 is capable of storing charge and, for example, is formed of a material which has electron trap sites. Practically, no current flows through the block insulating member 27 even when a voltage within a range of drive voltages of the semiconductor memory device 1 is applied.

The thickness of the silicon oxide formed through oxidation varies depending on a distance from the central axis of the memory hole MH to the side surface of the charge storage member 26 at the time of forming the charge storage member 26.

The insulating member 11 and the interlayer insulating members 12 and 36 to 39 are formed of, for example, silicon oxide ($SiO_2$). The back-gate electrode BG and the word lines WL, and selection-gate electrode SG are formed of, for example, silicon (Si). The stopper member 14 is formed of, for example, a tantalum oxide member ($Ta_2O_5$). The contact plug $CP_{SL}$, the contact plug $CP_{BL}$, the source line SL, and the bit line BL are formed of, for example, tungsten (W).

A diameter of the memory hole MH is larger at the upper section and the lower the section, the smaller the diameter. A member thickness of the tunnel insulating member 25 is less at the upper section and the lower the section, the greater the thickness.

Hereinafter, a diameter of a circumscribed circle of the memory hole MH in an XY plane is referred to as a diameter of the memory hole MH.

Next, a method for manufacturing the semiconductor memory device according to the embodiment will be described.

FIGS. 2 to 5 are cross-sectional views illustrating the method for manufacturing the semiconductor memory device according to the embodiment.

Figure 2:
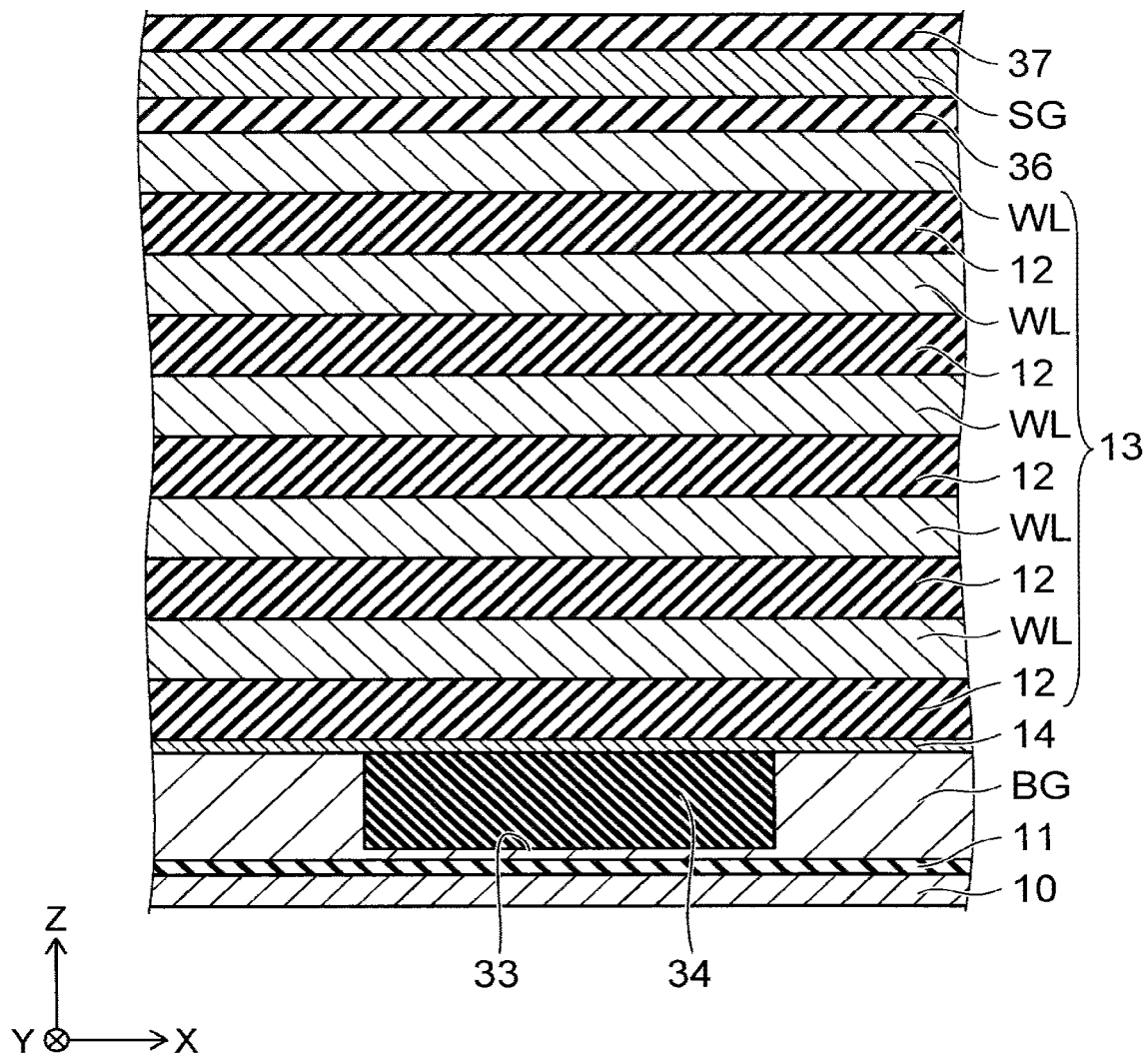
FIGS. 2 to 5 are cross-sectional views illustrating the method for manufacturing the semiconductor memory device according to the first embodiment.

First, as illustrated in FIG. 2, the insulating member 11 that is formed of silicon oxide is formed on the silicon substrate 10 through, for example, high density plasma chemical vapor deposition (HDP-CVD) and the back-gate electrode BG is formed on the insulating member 11. Then, a range in which a groove 33 is formed using lithography is specified, etching is performed, and thereby the back-gate electrode BG is selectively removed such that the groove 33 is formed. Then, for example, non-doped silicon is caused to be deposited in the groove 33 such that a sacrificial member 34 is formed. Being non-doped indicates that impurities (dopant impurities) which impart conductivity to the silicon are not added intentionally such that no dopant impurities are contained practically except for elements produced due to a source gas during the deposition. Then, for example, the tantalum oxide member ($Ta_2O_5$) is caused to be deposited on the back-gate electrode BG and the sacrificial member 34 such that the stopper member 14 is formed. Then, the interlayer insulating members 12 and the word lines WL are stacked alternately on the stopper member 14 such that the stacked body 13 is formed. Then, the interlayer insulating member 36, the selection-gate electrode SG, and the interlayer insulating member 37 are stacked in this order on the stacked body 13.

Figure 3:
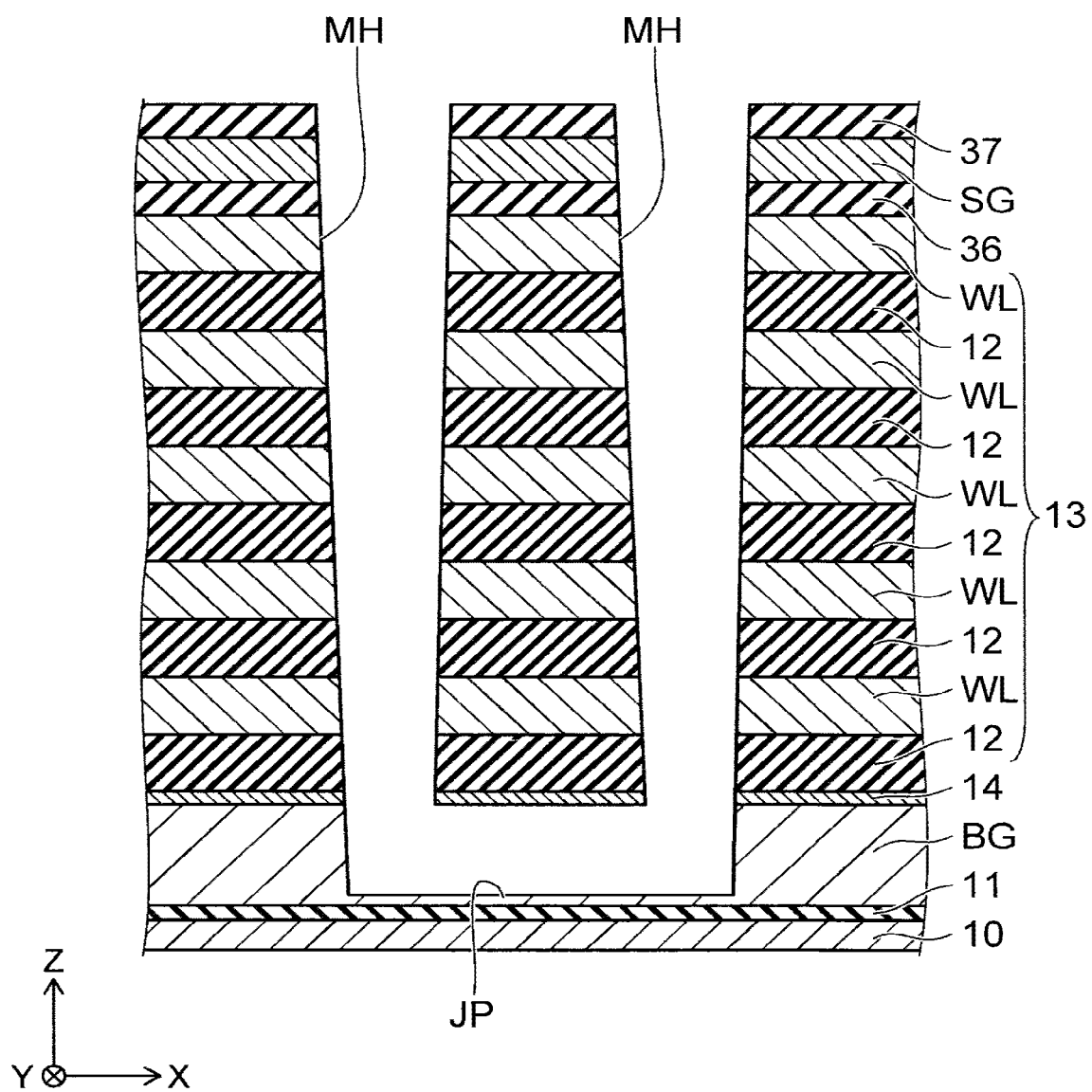

Next, as illustrated in FIG. 3, a range in which the memory hole MH is formed using lithography is specified, etching is performed, and thereby the stacked body from the interlayer insulating member 37 to the stopper member 14 is selectively removed such that the memory hole MH which penetrates the stacked body in the Z-direction is formed. Then, the lower end of the memory hole MH reaches the sacrificial member 34 and the sacrificial member 34 is exposed at the end of the memory hole MH. A pair of memory holes MH are formed on a single sacrificial member 34. Then, the sacrificial member 34 is removed, for example, using wet etching. The removal of the sacrificial member 34 causes the groove 33 formed in the back-gate electrode BG to be revealed. The revealed groove 33 becomes the junction portion JP. The lower ends of the pair of the memory holes MH are connected to the single common junction portion JP, which forms a single U-shaped cavity.

At this time, the diameter of the memory hole MH is larger at the upper section unavoidably and is smaller at the lower section. For example, the diameter of the memory hole MH is about 80 nm at the uppermost word line WL. In addition, the diameter of the memory hole MH is about 50 nm at the lowermost word line WL.

Figure 4:
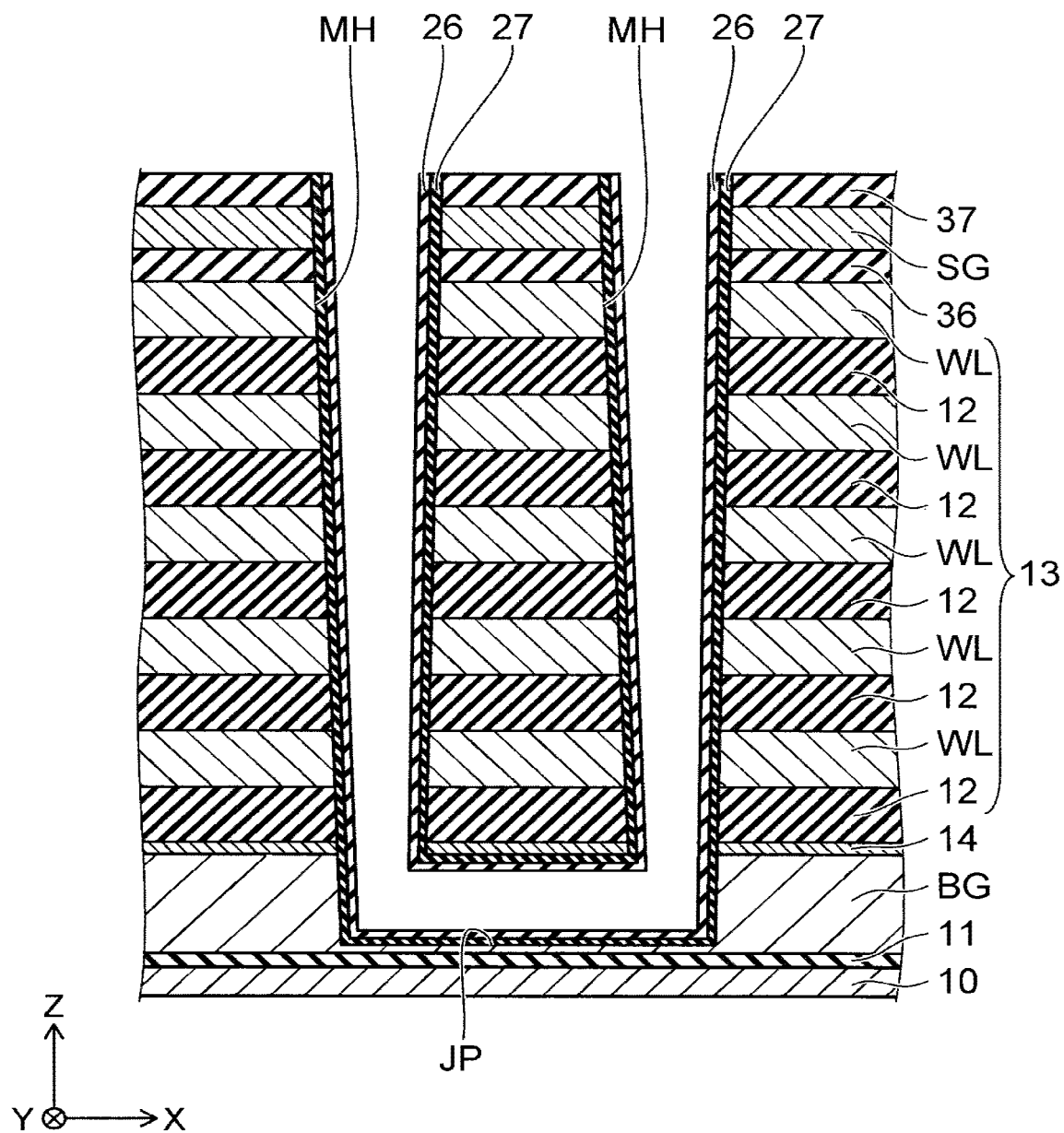

Next, as illustrated in FIG. 4, for example, silicon oxide ($SiO_2$) with a thickness of about 10 nm is deposited on the side surface of the pair of memory holes MH and the junction portion JP using a chemical vapor deposition (CVD) method or an atomic layer deposition (ALD) method such that the block insulating member 27 is formed. Then, for example, silicon nitride ($Si_3N_4$) with a thickness of about 7 nm is deposited on the upper surface of the block insulating member 27 using the same method as in the deposition of the block insulating member 27 such that the charge storage member 26 is formed. The member thickness of the charge storage member 26 is set in consideration of the reduction of the member thickness through oxidation to be performed later.

Figure 5:
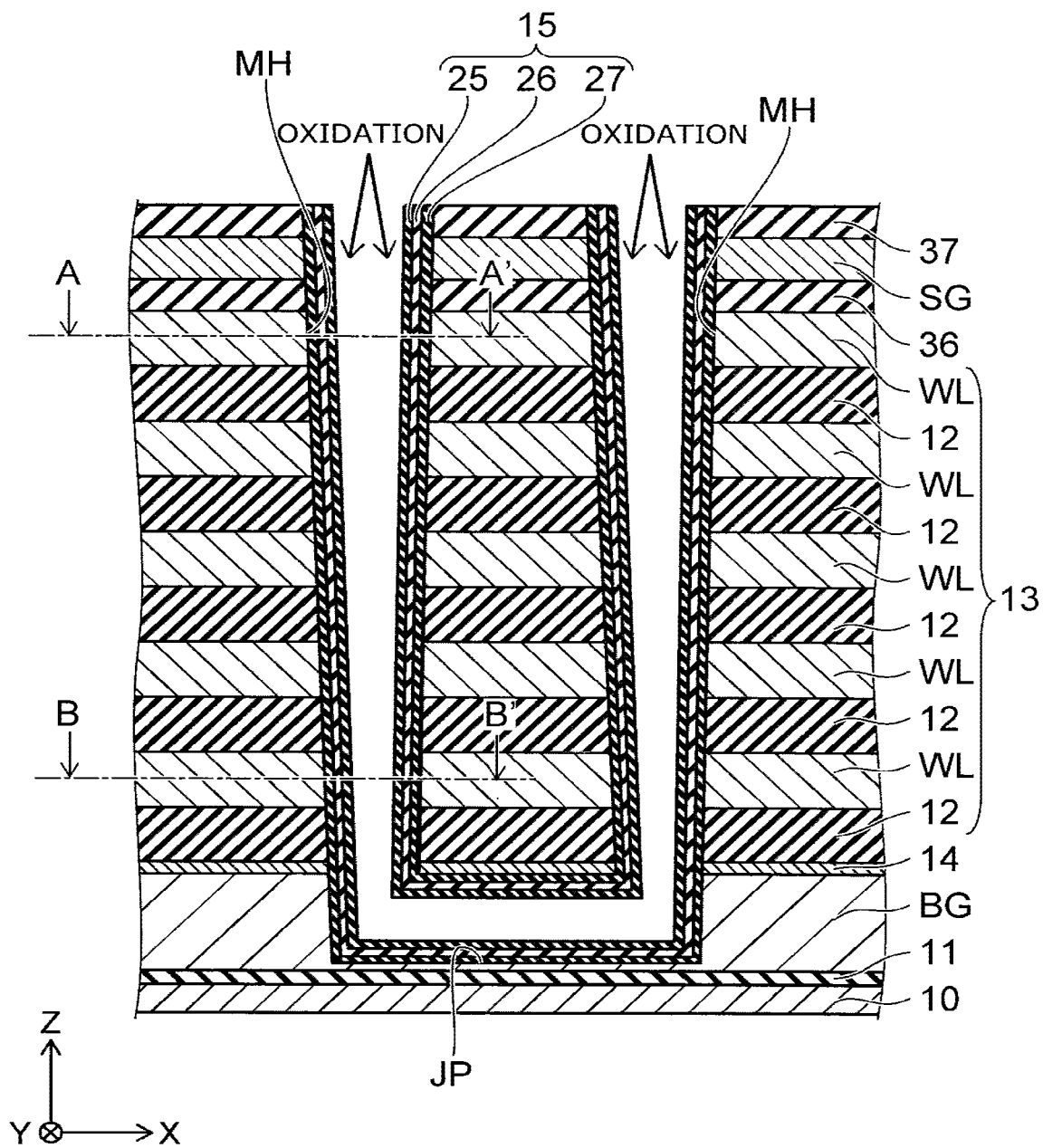

Next, as illustrated in FIG. 5, for example, the surface of the charge storage member 26 is oxidized using a radical oxidation method such that silicon oxide is formed. The formed silicon oxide becomes the tunnel insulating member 25. The charge storage member 26 remaining without being subjected to the oxidation has a decreased member thickness. At this time, the smaller the diameter of the memory hole MH, the greater the member thickness of the formed tunnel insulating member 25. This is because, as the diameter becomes smaller, a volume expansion is performed in a narrower region and the member thickness increases more.

Figure 6:
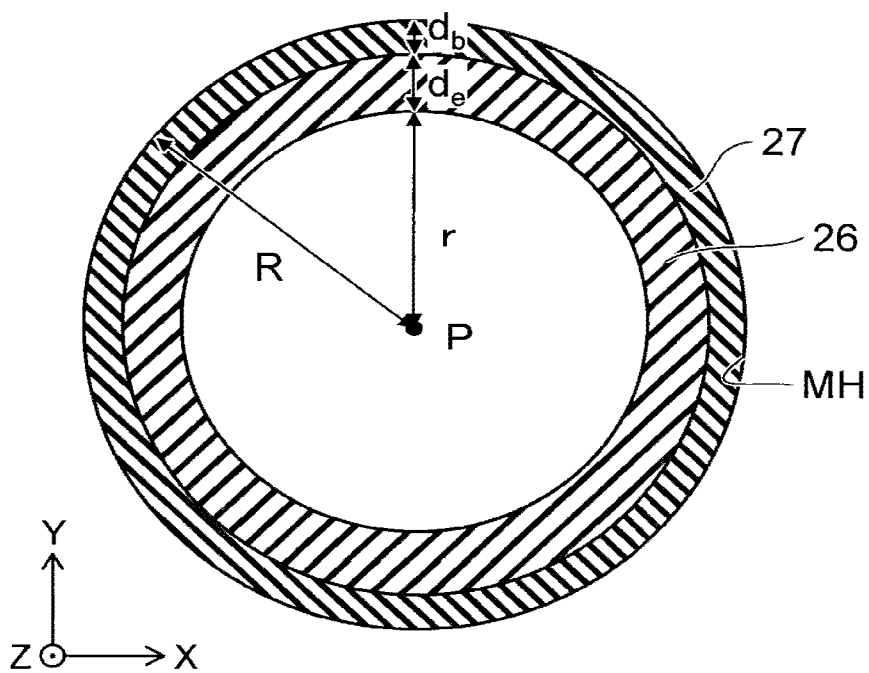
FIG. 6 is a cross-sectional view illustrating the block insulating member and the charge storage member before the oxidation in the semiconductor memory device according to the first embodiment when viewed from the upper section.

FIG. 6 is a cross-sectional view illustrating the block insulating member and the charge storage member before the oxidation in the semiconductor memory device according to the embodiment when viewed from the upper section.

Figure 7:
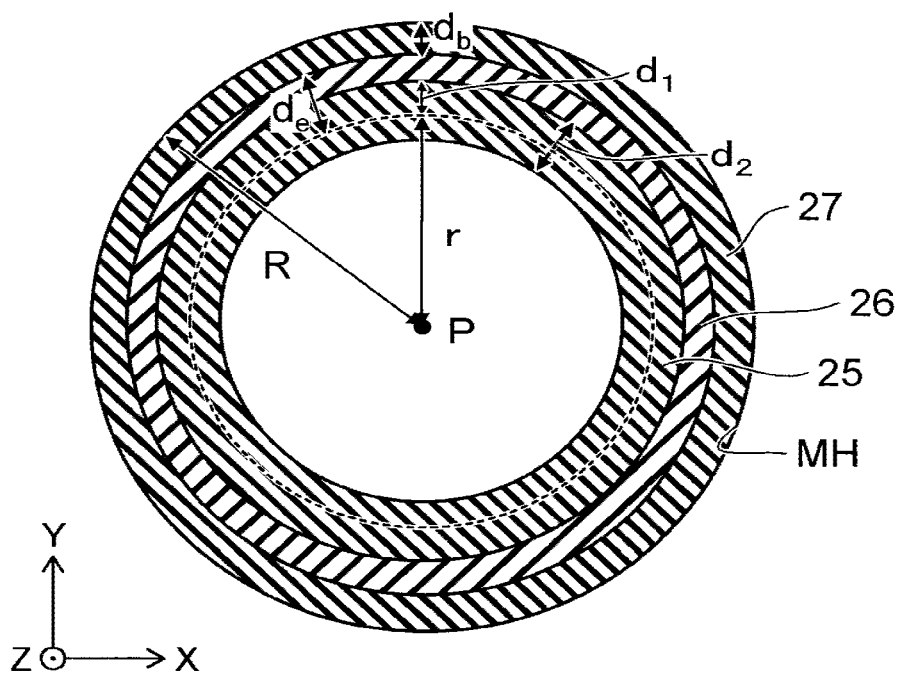
FIG. 7 is a cross-sectional view illustrating the block insulating member, the charge storage member after the oxidation, and the tunnel insulating member in the semiconductor memory device according to the first embodiment when viewed from the upper section.

FIG. 7 is a cross-sectional view illustrating the block insulating member, the charge storage member after the oxidation, and the tunnel insulating member in the semiconductor memory device according to the embodiment when viewed from the upper section.

As illustrated in FIG. 6, a distance r indicates a distance from a central axis P of the memory hole MH to the side surface of the charge storage member 26 at the time of forming the charge storage member 26. In addition, $d_b$ indicates a member thickness of the block insulating member 27, $d_e$ indicates a member thickness of the charge storage member 26 before the oxidation, and R indicates a radius of the memory hole MH.

As illustrated in FIG. 7, $d_1$ indicates a member thickness of the charge storage member 26 which is consumed by the oxidation and $d_2$ indicates a member thickness of the tunnel insulating member 25 formed by the oxidation. Here, when a volume increase rate during conversion of the silicon nitride member into the silicon oxide member is a, the following Expression 1 is established with respect to a volume per unit length in the Z-direction.

$$\alpha \times \pi \times \{(r+d_1)^2 - r^2\} = \pi \times \{(r+d_1)^2 - (r+d_1-d_2)^2\} \qquad \text{Expression 1}$$

The left-hand side of the above Expression 1 indicates a times the volume of the consumed silicon nitride member and the right-hand side of the above Expression 1 indicates a volume of the formed silicon oxide member. The above Expression 1 indicates that a times the volume of the consumed silicon nitride member and the volume of the formed silicon oxide member are equal. Next, the above Expression 1 is solved with respect to $d_2$, which forms the following Expression 2.

$$d_2 = (r+d_1) - \sqrt{(r+d_1)^2 - \alpha \times d_1 \times (2 \times r + d_1)} \qquad \text{Expression 2}$$

Here, the above Expression 2 is described. In order to obtain a relationship between $d_2$ and the distance r, the above Expression 2 is partial-differentiated with respect to the distance r, which forms the following Expression 3.

$$\frac{\partial d_2}{\partial r} = 1 - \frac{r + d_1 - \alpha \times d_1}{\sqrt{(r+d_1)^2 - \alpha \times d_1 \times (2 \times r + d_1)}} \qquad \text{Expression 3}$$

Here, when the above Expression 3 satisfies the following Expression 4, the above Expression 3 becomes a decreasing function with respect to the distance r. That is, the member thickness $d_2$ of the tunnel insulating member 25 formed through the oxidation decreases as the distance r increases.

$$\frac{\partial d_2}{\partial r} < 0 \qquad \text{Expression 4}$$

When the condition of the above Expression 4 is applied to the above Expression 3, the following Expression 5 is formed.

$$1 - \frac{r + d_1 - \alpha \times d_1}{\sqrt{(r+d_1)^2 - \alpha \times d_1 \times (2 \times r + d_1)}} < 0 \qquad \text{Expression 5}$$

After the second term on the left-hand side of the above Expression 5 is moved to the right-hand side, both the sides are squared and reorganized and then the following Expression 6 is formed.

$$\alpha \times d_1^2 \times (\alpha - 1) > 0 \qquad \text{Expression 6}$$

In order to establish the above Expression 6, the condition of the volume increase rate $\alpha > 1$ has to be satisfied. That is, in a case of the volume increase rate $\alpha > 1$, the member thickness $d_2$ of the tunnel insulating member 25 which is formed through the oxidation forms a decreasing function with respect to the distance r. According to the embodiment, a material which satisfies the volume increase rate $\alpha > 1$ is used.

When the distance r becomes smaller, the member thickness $d_2$ of the tunnel insulating member 25 which is formed through the oxidation becomes greater. This is because the member thickness increases more when the charge storage member 26 is subjected to the volume expansion in a narrow region.

In addition, as illustrated in FIG. 6, a relationship of the following Expression 7 is formed between a radius R of the memory hole MH, the distance r, the member thickness $d_e$ of the charge storage member 26 before the oxidation, and the member thickness $d_b$ of the block insulating member 27.

$$R = (r + d_e + d_b) \qquad \text{Expression 7}$$

Figure 8:
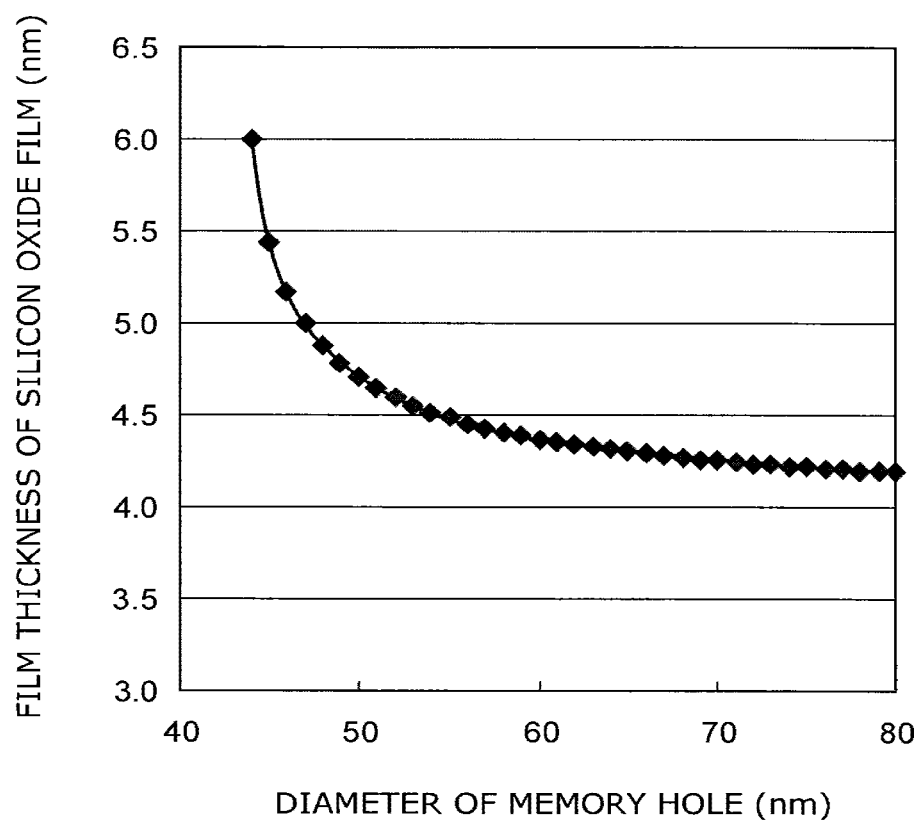
FIG. 8 is a graph illustrating the member thickness of the tunnel insulating member that is formed through the oxidation, in which the diameter of the memory hole is shown as the abscissa and the member thickness of the silicon oxide member is shown as the ordinate.

FIG. 8 is a graph illustrating the member thickness of the tunnel insulating member that is formed through the oxidation, in which the diameter of the memory hole is shown as the abscissa and the member thickness of the silicon oxide member is shown as the ordinate.

Figure 9:
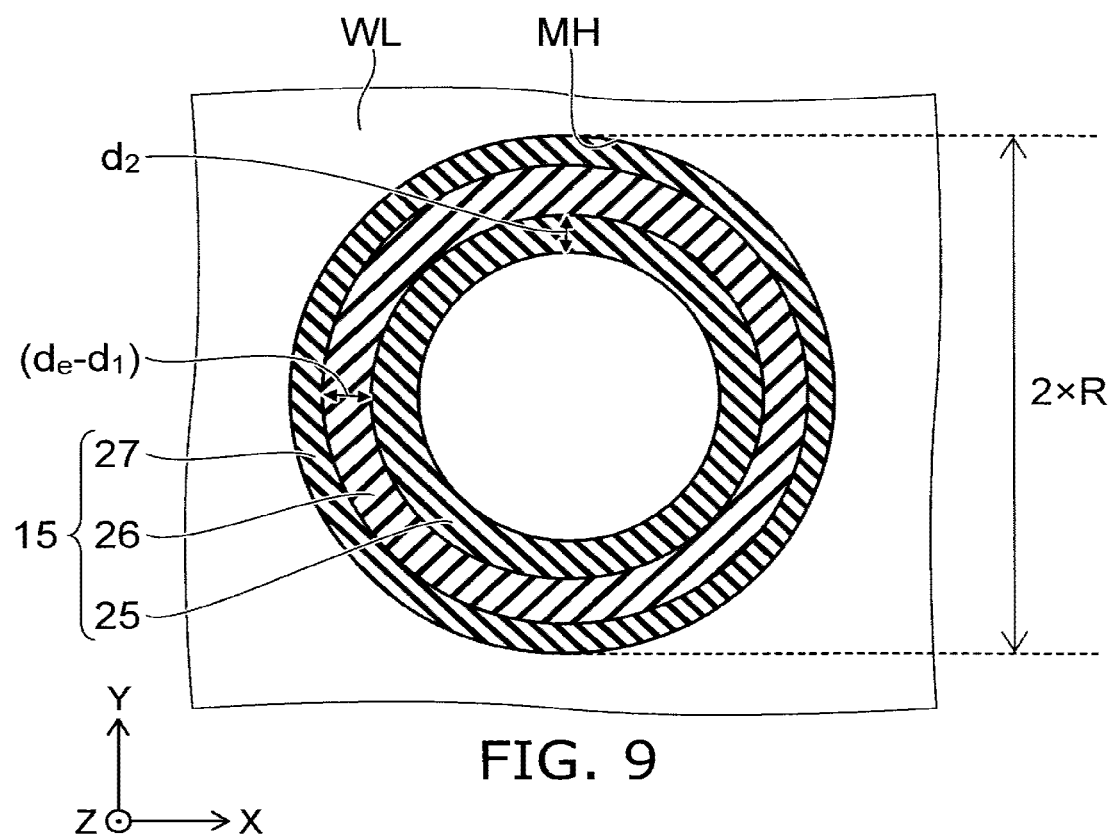
FIG. 9 is a cross-sectional view taken along line IX-IX shown in FIG. 5.

FIG. 9 is a cross-sectional view taken along line IX-IX shown in FIG. 5.

Figure 10:
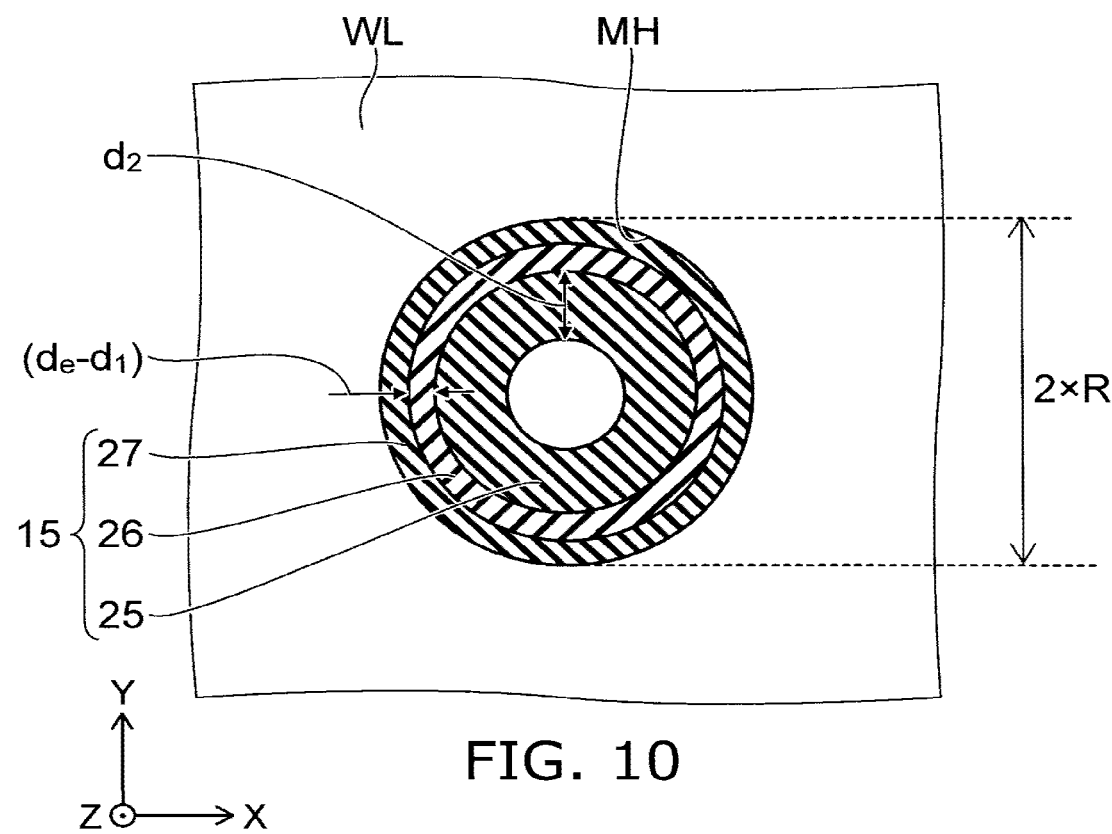
FIG. 10 is a cross-sectional view taken along line X-X shown in FIG. 5.

FIG. 10 is a cross-sectional view taken along line X-X shown in FIG. 5.

FIG. 8 is a graph illustrating the member thickness of the formed tunnel insulating member based on the above Expression 2 and the above Expression 7. Here, the member thickness $d_1$ of the charge storage member 26 which is consumed through the oxidation is, for example, about 2 nm and the volume increase rate $\alpha$ is, for example, about 2. The member thickness $d_b$ of the block insulating member 27 is, for example, about 10 nm and the member thickness $d_e$ of the charge storage member 26 before the oxidation is, for example, about 7 nm.

As illustrated in FIG. 8, the smaller the diameter (2×R) of the memory hole, the greater the member thickness $d_2$ of the formed tunnel insulating member 25. This is because the volume expansion is performed in the narrower region and the member thickness increases more as the diameter of the memory hole becomes smaller.

For example, as illustrated in FIG. 9, in a case where the diameter (2×R) of the memory hole MH is about 80 nm and the member thickness $d_e$ of the charge storage member 26 before the oxidation is about 7.0 nm, a member thickness of about 4.2 nm from the surface is converted into silicon oxide through oxidation. The oxidized member thickness of about 4.2 nm becomes the member thickness $d_2$ of the tunnel insulating member 25 and the final member thickness ($d_e$−$d_1$) of the charge storage member 26 is about 5 nm which is not oxidized but remains.

In addition, for example, as illustrated in FIG. 10, in a case where the diameter (2×R) of the memory hole MH is about 50 nm and the member thickness $d_e$ of the charge storage member 26 before the oxidation is about 7.0 nm, an oxidized member thickness is about 4.7 nm. In this case, the member thickness is greater than in a case where the diameter is about 80 nm.

For example, in a case where a cross-sectional shape of the memory hole MH is ellipsoidal in an XY plane, the tunnel insulating member 25 is formed in accordance with a curvature radius of the ellipse. The tunnel insulating member 25 is formed to be thick in a portion where the curvature radius of the ellipse is small, and the tunnel insulating member 25 is formed to be thin in a portion where the curvature radius is large.

FIGS. 11 to 14 are cross-sectional views illustrating the method for manufacturing the semiconductor memory device according to the embodiment.

Figure 11:
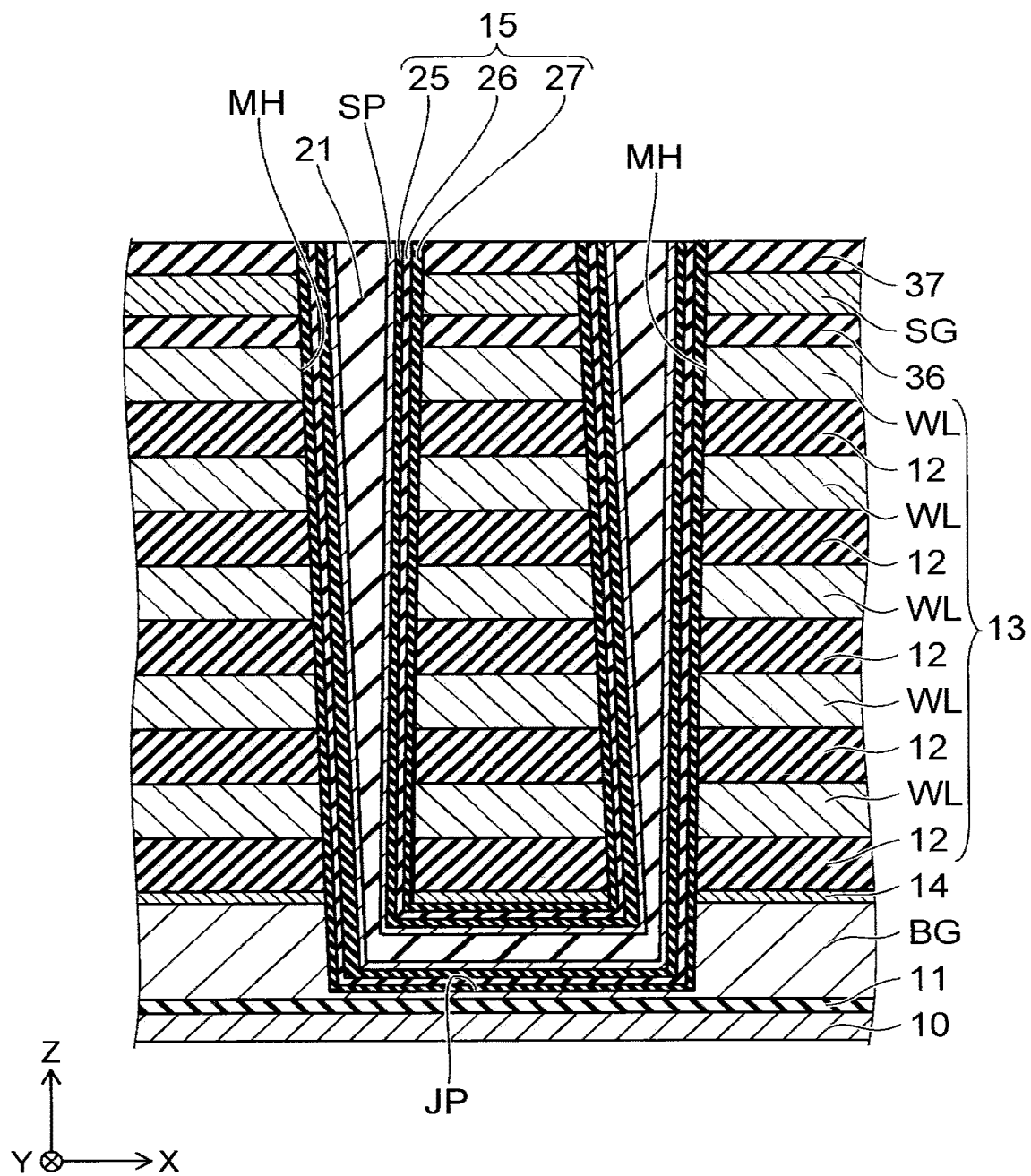
FIGS. 11 to 14 are cross-sectional views illustrating the method for manufacturing the semiconductor memory device according to the first embodiment.

After the tunnel insulating member 25 shown in FIG. 5 is formed, as illustrated in FIG. 11, amorphous silicon (a-Si) with a thickness of about 4 nm is deposited on the side surface of the tunnel insulating member 25 using a CVD method or an ALD method such that the silicon pillar SP is formed. Then, the inside of the pair of memory holes MH and the junction portion JP is filled with an insulating material such that the insulating member 21 is formed.

Figure 12:
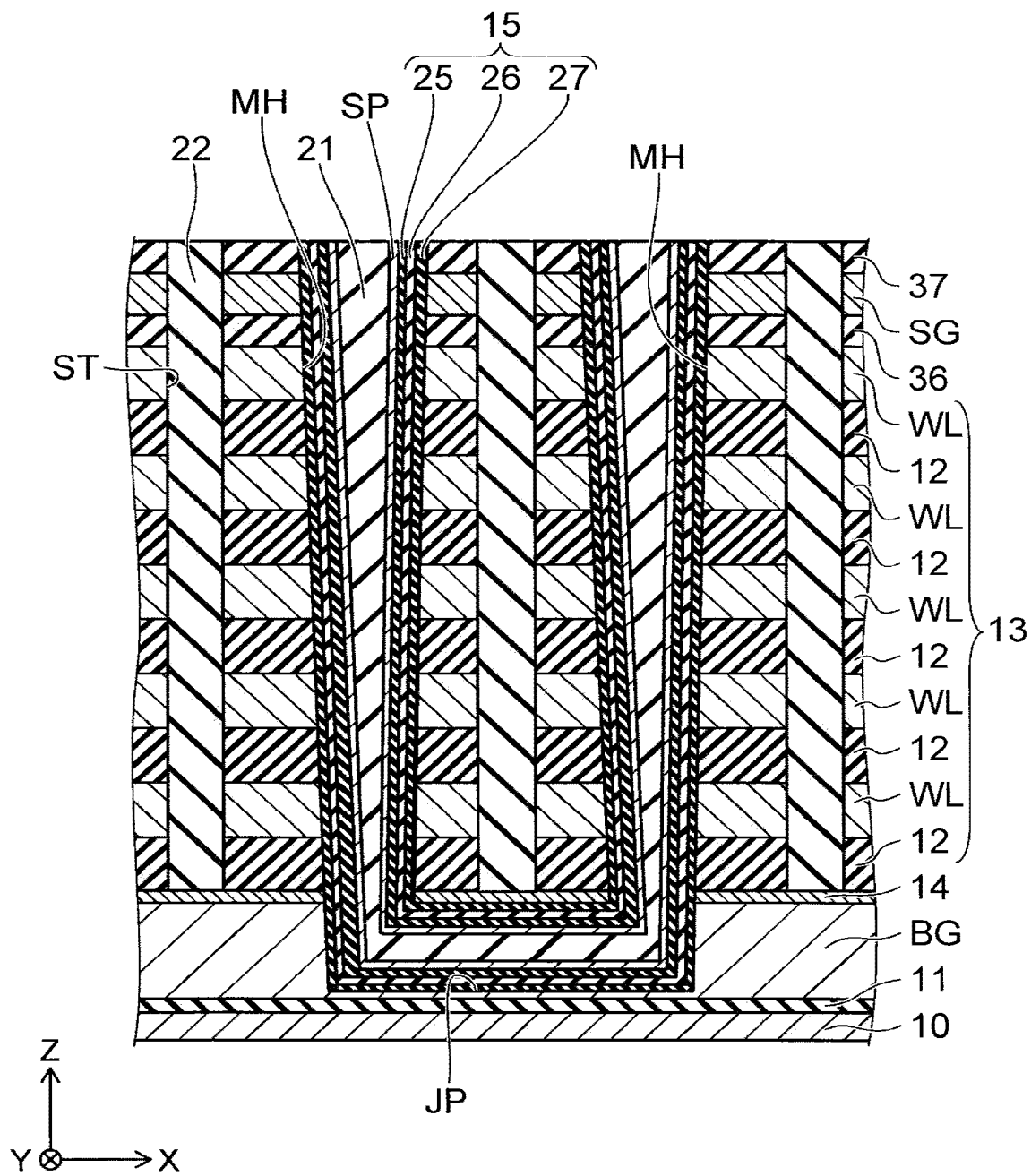

Next, as illustrated in FIG. 12, a range in which the slit ST is formed using lithography is specified, etching is performed with the stopper member 14 as a stopper, and thereby the stacked body from the interlayer insulating member 37 to the stacked body 13 is selectively removed such that the slit ST which penetrates the stacked body in the Z-direction and extends in the Y-direction is formed. Then, the inside of the slit ST is filled with the insulating material such that the insulating member 22 is formed.

Figure 13:
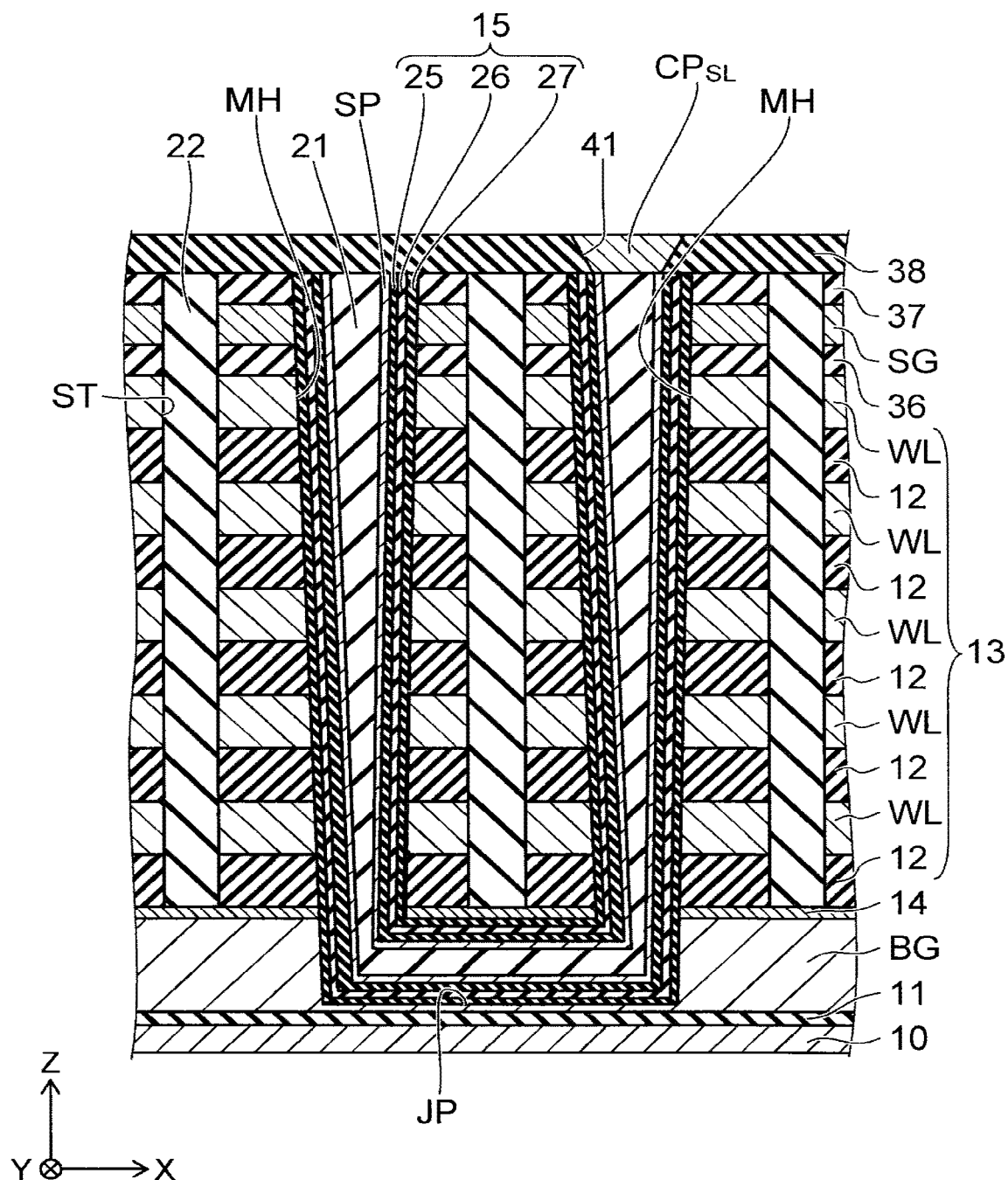

Next, as illustrated in FIG. 13, after the interlayer insulating member 38 is formed on the memory member 15, the silicon pillar SP, the insulating member 21, the insulating member 22, and the interlayer insulating member 37, the contact hole 41 is formed by performing lithography and etching. Then, for example, tungsten (W) is deposited on the inside of the contact hole 41 such that the contact plug $CP_{SL}$ is formed.

Figure 14:
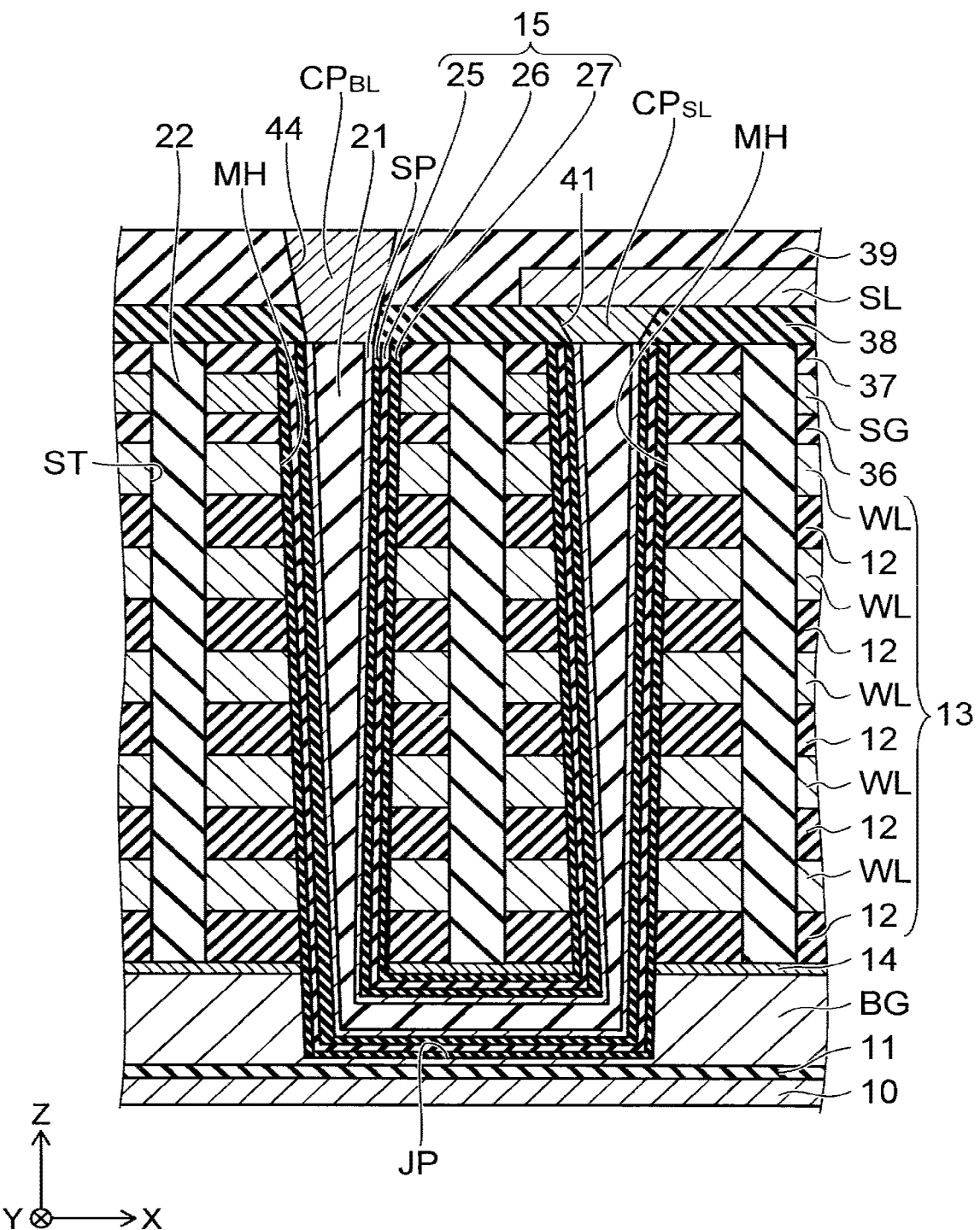

Next, as illustrated in FIG. 14, the source line SL that extends in the Y-direction is formed on the contact plug $CP_{SL}$ using, for example, a Damascene technique. Then, after the interlayer insulating member 39 is formed on the interlayer insulating member 38 and the source line SL, the contact hole 44 is formed by performing lithography and etching. Then the contact plug $CP_{BL}$ is formed using the same method as the method for forming the contact plug $CP_{SL}$.

Next, as illustrated in FIG. 1, the bit line BL that extends in the X-direction is formed on the contact plug $CP_{BL}$ using, for example, a Damascene technique.

Radical oxidation is an example of oxidation of the charge storage member 26; however, the oxidation is not limited to this example. For example, thermal oxidation or plasma oxidation may be performed, or a combination of these two types of oxidation may be performed.

Next, an operation of the semiconductor memory device according to the embodiment will be described.

Figure 15:
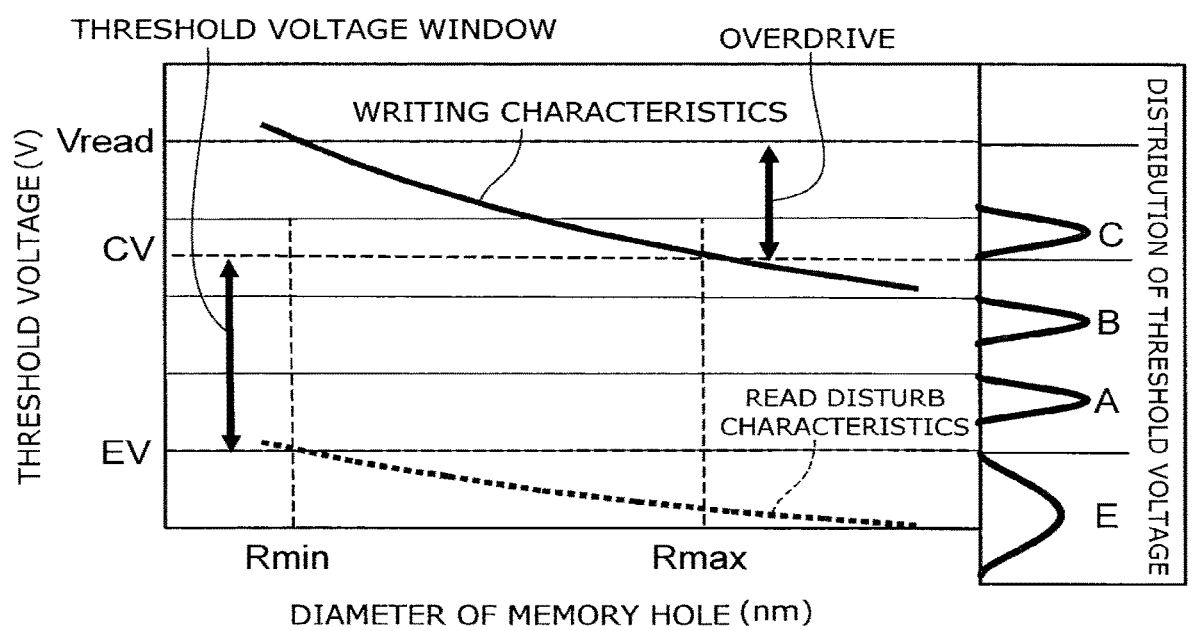
FIG. 15 is a graph illustrating a threshold voltage window of the semiconductor memory device according to the first embodiment, in which the diameter of the memory hole is shown as the abscissa and the threshold voltage is shown as the ordinate.

FIG. 15 is a graph illustrating a threshold voltage window of the semiconductor memory device according to the embodiment, in which the diameter of the memory hole is shown as the abscissa and the threshold voltage is shown as the ordinate.

Distributions of the threshold voltage in FIG. 15 show distributions of the threshold voltage in a case of four values and the four values are C-level, B-level, A-level, and E-level in descending order of threshold.

Among the threshold voltage distributions in FIG. 15, a distribution shown at the uppermost place shows the threshold voltage distribution of the C-level. A distribution shown at the second place from the top shows the threshold voltage distribution of the B-level. A distribution shown at the third place from the top shows the threshold voltage distribution of the A-level. A distribution shown at the lowermost place shows the threshold voltage distribution of the E-level.

"Writing characteristics" illustrated in FIG. 15 shows the threshold voltage after writing in a case where a predetermined writing voltage is applied to the word line WL that configures a certain memory cell and a value of C-level is written. The threshold voltage after writing depends on the diameter (2×R) of the memory hole MH. The larger the diameter of the memory hole MH, the lower the likelihood of the electric field being concentrated and the lower the threshold voltage after writing. Therefore, as the lower limit value of the C-level in the threshold voltage distribution, a threshold voltage CV required when the diameter of the memory hole MH is the maximum value Rmax has to be assumed. In addition, the threshold voltage corresponding to the B-level needs to be set in a range lower than the threshold voltage CV.

"Read voltage Vread" shown in FIG. 15 is a voltage that is applied to another memory cell configured of the same silicon pillar SP as the memory cell which is a read target such that the memory cell is in an ON state regardless of a value that is written in. Thus, the read voltage Vread needs to be set to be much higher than the C-level which is the highest threshold voltage level. A difference between the read voltage Vread and the threshold voltage CV is "overdrive Vod".

In addition, "read disturb characteristics" show an amount of change of the threshold voltage due to a tunneling current unavoidably flowing in the memory cell when a predetermined read voltage Vread has been applied to the memory cell of E-level. The greater the difference between the read voltage Vread and the original threshold voltage written in to the memory cell, the more the amount of threshold voltage change due to the read disturb. An amount of the threshold voltage change of the memory cell of the E-level in a state of being removed is greatest. In addition, the read disturb characteristics depends on the diameter of the memory hole MH, and thus the smaller the diameter of the memory hole MH, the greater the amount of the change of the threshold level in order for the electric field to be concentrated. Therefore, as the upper limit value of the E-level in the threshold voltage distribution, a threshold voltage EV required when the diameter of the memory hole MH is the minimum value Rmin has to be assumed. In addition, the threshold voltage corresponding to the A-level needs to be set in a range higher than the threshold voltage EV.

As illustrated in FIG. 1, in the semiconductor memory device 1 according to the embodiment, the diameter of the memory hole MH changes depending on a position in the Z-direction and, for example, the lower the position, the smaller the diameter. As illustrated in FIG. 15, in a case where the diameter of the memory hole MH in a single memory cell or memory cell string changes in a range from the minimum value Rmin to the maximum value Rmax, a reliable predetermined value is written regardless of the size of the diameter of the memory hole MH and in order to read, there is a need to set the threshold voltage of the A-level and the threshold voltage of the B-level to be within a range of the "threshold voltage window W" which is greater than the value EV and less than the value CV. The greater the range of the change (Rmax-Rmin) of the diameter of the memory hole MH, the narrower the threshold window W, and the smaller a margin of the threshold voltage between levels, which causes the operation of the semiconductor memory device 1 to be difficult.

According to the embodiment, the smaller the diameter of the memory hole MH, the thicker the tunnel insulating member 25. Thus, the electric field is likely to be concentrated on the tunnel insulating member 25 of the memory cell. However, when the tunnel insulating member 25 is thick, the effect of preventing the tunneling current from flowing is excellent. Therefore, it is possible to decrease the threshold voltage of the E-level when the diameter of the memory hole MH is the minimum value Rmin. That is, the member thickness of the tunnel insulating member 25 becomes greater, which prevents the read disturb from occurring. Then, it is possible to decrease the threshold voltage EV. As a result, the threshold window W is widened and it is possible to stabilize driving of the semiconductor memory device 1.

Next, an effect of the embodiment will be described.

In the semiconductor memory device according to the embodiment, it is possible to widen the threshold window W by (a) and (b) shown in the following description.

(a) The larger the diameter (2×R) of the memory hole MH, the thinner the tunnel insulating member 25.

According to (a), if the same cell current is obtained, it is possible to decrease the overdrive Vod to an equivalent amount obtained as the electrical member thickness (EOT) of the tunnel insulating member 25 becomes thinner. The decrease of the overdrive Vod brings about decrease of the read voltage Vread. Thus, the read disturb is unlikely to occur and it is possible to decrease the threshold voltage EV.

(b) The smaller the diameter (2×R) of the memory hole MH, the thicker the tunnel insulating member 25.

According to (b), the tunneling current, particularly a direct tunneling current is unlikely to flow. Therefore, the read disturb is unlikely to occur and it is possible to decrease the threshold voltage EV.

According to (a) and (b), since it is possible to decrease the threshold voltage EV, it is possible to widen the threshold window W.

Table 1 shows experimental examples of the threshold voltage window of the semiconductor memory device according to the embodiment. The member thickness of the tunnel insulating member is represented by T.

Example 1 in Table 1 shows an example of a case where the diameter of the memory hole MH in the upper section is 80 nm, the member thickness of the tunnel insulating member 25 is 4.2 nm, the diameter in the lower section is 50 nm, and the member thickness is 4.7 nm. At this time, the threshold voltage CV, overdrive Vod, the read voltage Vread, the threshold voltage EV, and the threshold window W are 4.00 V, 2.72 V, 7.32 V, 1.32 V, and 2.68 V, respectively.

Comparative Example 1 in Table 1 shows an example of a case where the diameter of the memory hole MH in the upper section is 80 nm, the diameter in the lower section is 50 nm, and the member thickness of the tunnel insulating member 25 is 4.2 nm without change. At this time, the threshold voltage CV, overdrive Vod, the read voltage Vread, the threshold voltage EV, and the threshold window W are 4.00 V, 2.72 V, 7.32 V, 2.00 V, and 2.00 V, respectively.

Comparative Example 2 in Table 1 shows an example of a case where the diameter of the memory hole MH in the upper section is 80 nm, the diameter in the lower section is 50 nm, and the member thickness of the tunnel insulating member 25 is 4.7 nm without change. At this time, the threshold voltage CV, overdrive Vod, the read voltage Vread, the threshold voltage EV, and the threshold window W are 4.00 V, 2.77 V, 7.37 V, 1.37 V, and 2.63 V, respectively.

TABLE 1

| Experimental example | 2XR (nm) | T (nm) | CV (V) | Vod (V) | Vread (V) | EV (V) | W (V) |
|---|---|---|---|---|---|---|---|
| Example 1 | 80 | 4.2 | 4.00 | 2.72 | 7.32 | 1.32 | 2.68 |
|  | 50 | 4.7 |  |  |  |  |  |
| Comparative example 1 | 80 | 4.2 | 4.00 | 2.72 | 7.32 | 2.00 | 2.00 |
|  | 50 |  |  |  |  |  |  |
| Comparative example 2 | 80 | 4.7 | 4.00 | 2.77 | 7.37 | 1.37 | 2.63 |
|  | 50 |  |  |  |  |  |  |

As shown in Table 1 above, the semiconductor memory device according to Example 1 includes the tunnel insulating member which has the greater member thickness T at a portion where the memory hole MH has the minimum diameter of 50.0 nm, as compared to the semiconductor memory device according to Comparative Example 1. In addition, the semiconductor memory device according to Example 1 includes the tunnel insulating member which has the smaller member thickness T at a portion where the memory hole MH has the maximum diameter of 80.0 nm, as compared to the semiconductor memory device according to Comparative Example 2.

Thus, the overdrive Vod is decreased to 2.72 V and then it is possible to decrease the Read voltage Vread to 7.32 V.

The Read voltage Vread is decreased to 7.32 V, and thereby the threshold voltage EV is decreased to 1.32 V, and then, it is possible to widen the threshold window W to 2.68 V.

In the semiconductor memory device according to the embodiment, the larger the diameter of the memory hole MH, the smaller the member thickness of the tunnel insulating member, and the smaller the diameter of the memory hole MH, and the greater the member thickness of the tunnel insulating member. As a result, it is possible to provide the semiconductor memory device that includes a wide threshold window and a method for manufacturing the semiconductor memory device.

In addition, the member thickness of the tunnel insulating member 25 is automatically controlled by the diameter of the memory hole MH. In other words, the member thickness of the tunnel insulating member 25 which is self-aligning is determined. Therefore, the thickness of the tunnel insulating member 25 does not depend on the shape of the memory hole MH. For example, the embodiment may be applied to a bowed shape in which the memory hole MH has the maximum diameter at an intermediate layer of word lines WL of a single memory string and the member thickness of the tunnel insulating member 25 is determined according to the diameter of the memory hole MH.

Further, the embodiment may be applied to a case where the shape of the memory hole MH is ellipsoidal in a single layer of word lines WL and the tunnel insulating member 25 is formed according to the curvature radius. That is, since the smaller the curvature radius the thicker the tunnel insulating member 25 is formed to be, as a result, the central portion of the memory hole MH is formed to be closer to a circle. Normally, the smaller the curvature radius, the more the read disturb is likely to occur. Since the variation of the curvature radius in the memory hole MH according to the embodiment is decreased, it is possible to prevent the read disturb.

A magnitude relation of a diameter of the memory hole MH in an XZ plane can be confirmed as a magnitude relation of a width of the memory hole MH in the X direction.

Second Embodiment

Next, the second embodiment will be described.

Figure 16:
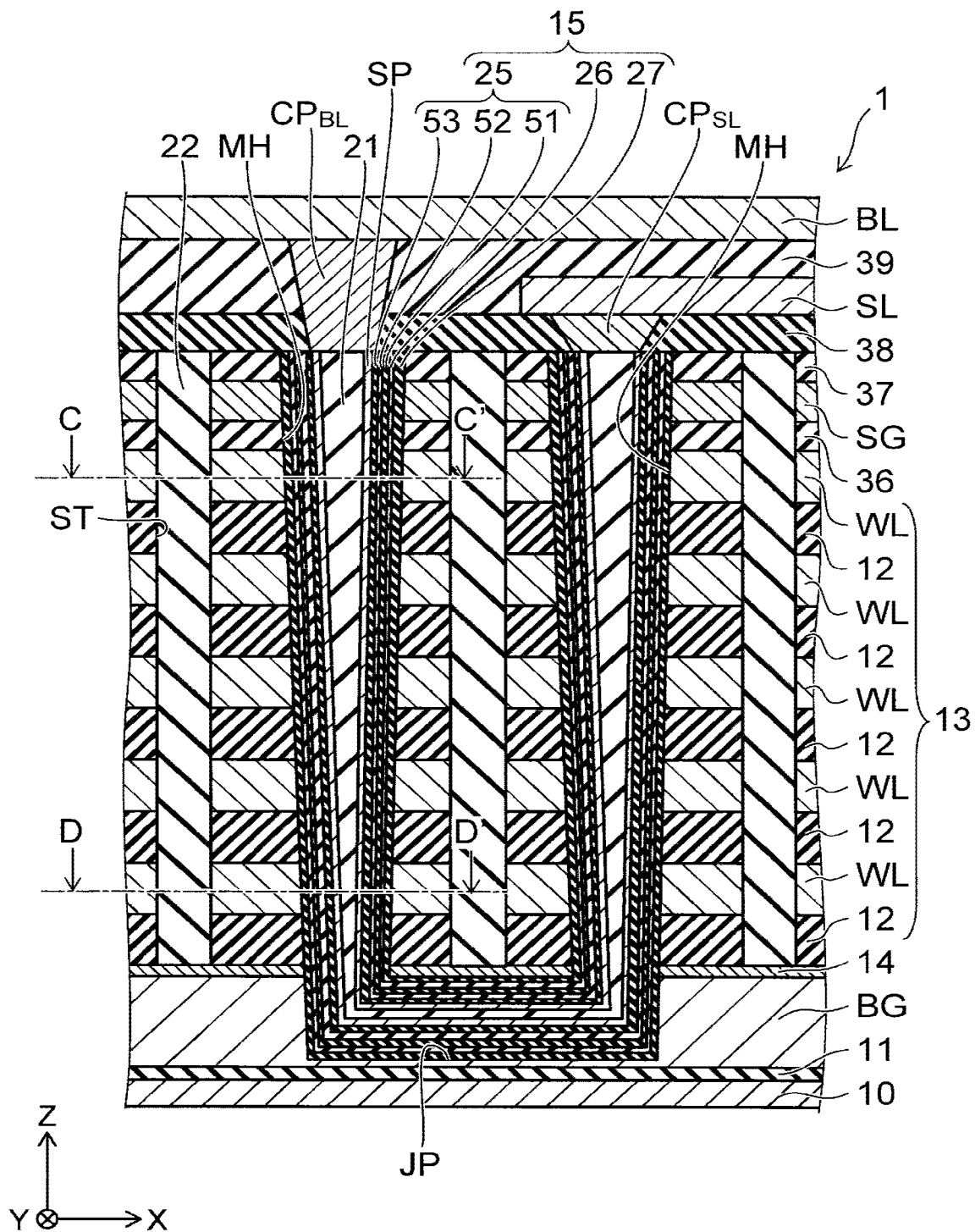
FIG. 16 is a cross-sectional view illustrating the semiconductor memory device according to a second embodiment.

FIG. 16 is a cross-sectional view illustrating the semiconductor memory device according to the embodiment.

Figure 17:
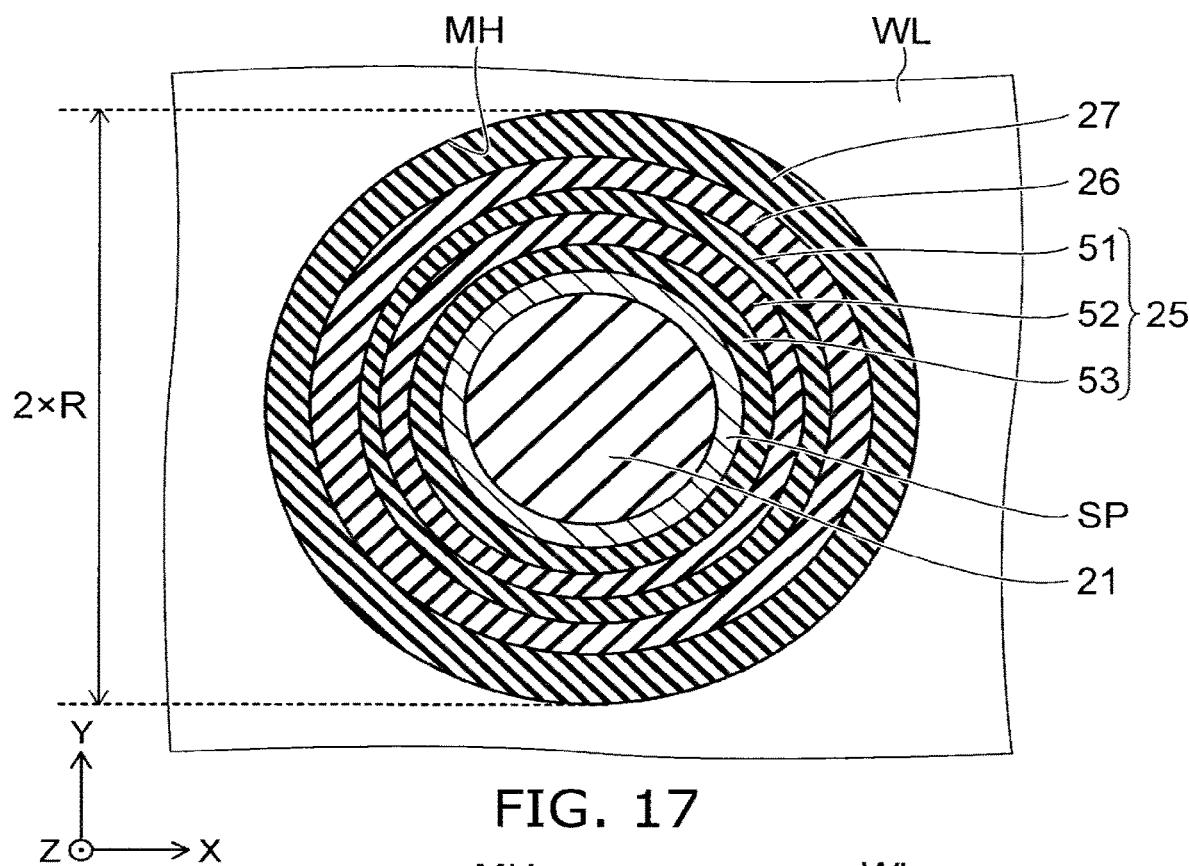
FIG. 17 is a cross-sectional view taken along line XVII-XVII shown in FIG. 16.

FIG. 17 is a cross-sectional view taken along line XVII-XVII shown in FIG. 16.

Figure 18:
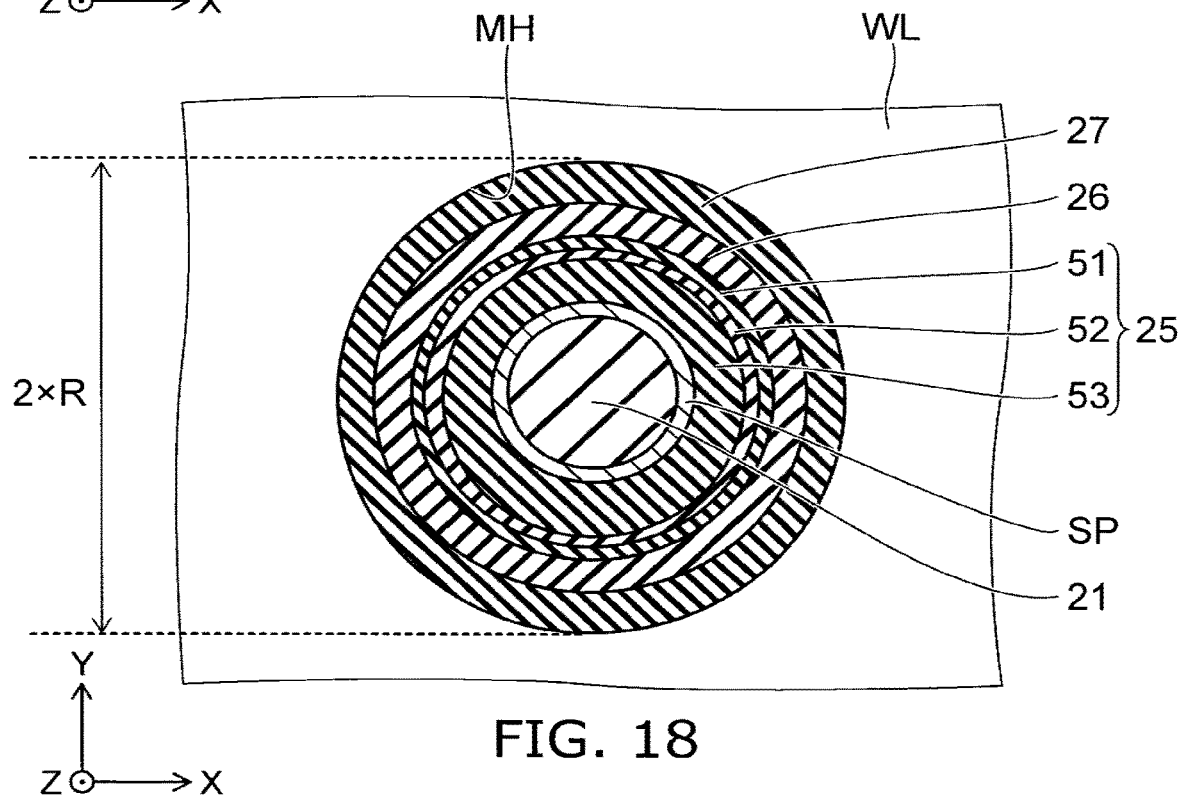
FIG. 18 is a cross-sectional view taken along line XVIII-XVIII shown in FIG. 16.

FIG. 18 is a cross-sectional view taken along line XVIII-XVIII shown in FIG. 16.

First, a configuration of the semiconductor memory device according to the embodiment is described.

As illustrated in FIG. 16, the tunnel insulating member 25 of the semiconductor memory device 1 according to the embodiment is formed of an oxide-nitride-oxide (ONO) member which includes a top-oxide member 51, a middle-nitride member 52, and a bottom-oxide member 53.

As illustrated in FIGS. 17 and 18, the larger the diameter (2×R) of the memory hole MH, the thinner the bottom-oxide member 53, and the smaller the diameter of the memory hole MH the thicker the bottom-oxide member 53.

For example, in FIG. 17, the thickness of the tunnel insulating member 25 formed of the ONO member is formed as follows. The diameter (2×R) of the memory hole MH is about 78 nm, the thickness of the block insulating member 27 is about 10 nm, the thickness of the charge storage member 26 is about 5.0 nm, the thickness of the top-oxide member 51 of the tunnel insulating member 25 is about 3.0 nm, the thickness of the middle-nitride member 52 is about 2.2 nm, the thickness of the bottom-oxide member 53 is about 1.6 nm, and the thickness of the silicon pillar SP is about 3.0 nm.

In FIG. 18, the thickness of the tunnel insulating member 25 formed of the ONO member is as follows. In a case where the diameter (2×R) of the memory hole MH is about 52 nm, the thickness of the bottom-oxide member 53 is about 1.8 nm. The member thicknesses other than the bottom-oxide member 53 are the same as those in FIG. 17.

Configurations according to the embodiment which are not described above are the same as those of the first embodiment.

Next, the method for manufacturing the semiconductor memory device according to the embodiment will be described.

Figure 19:
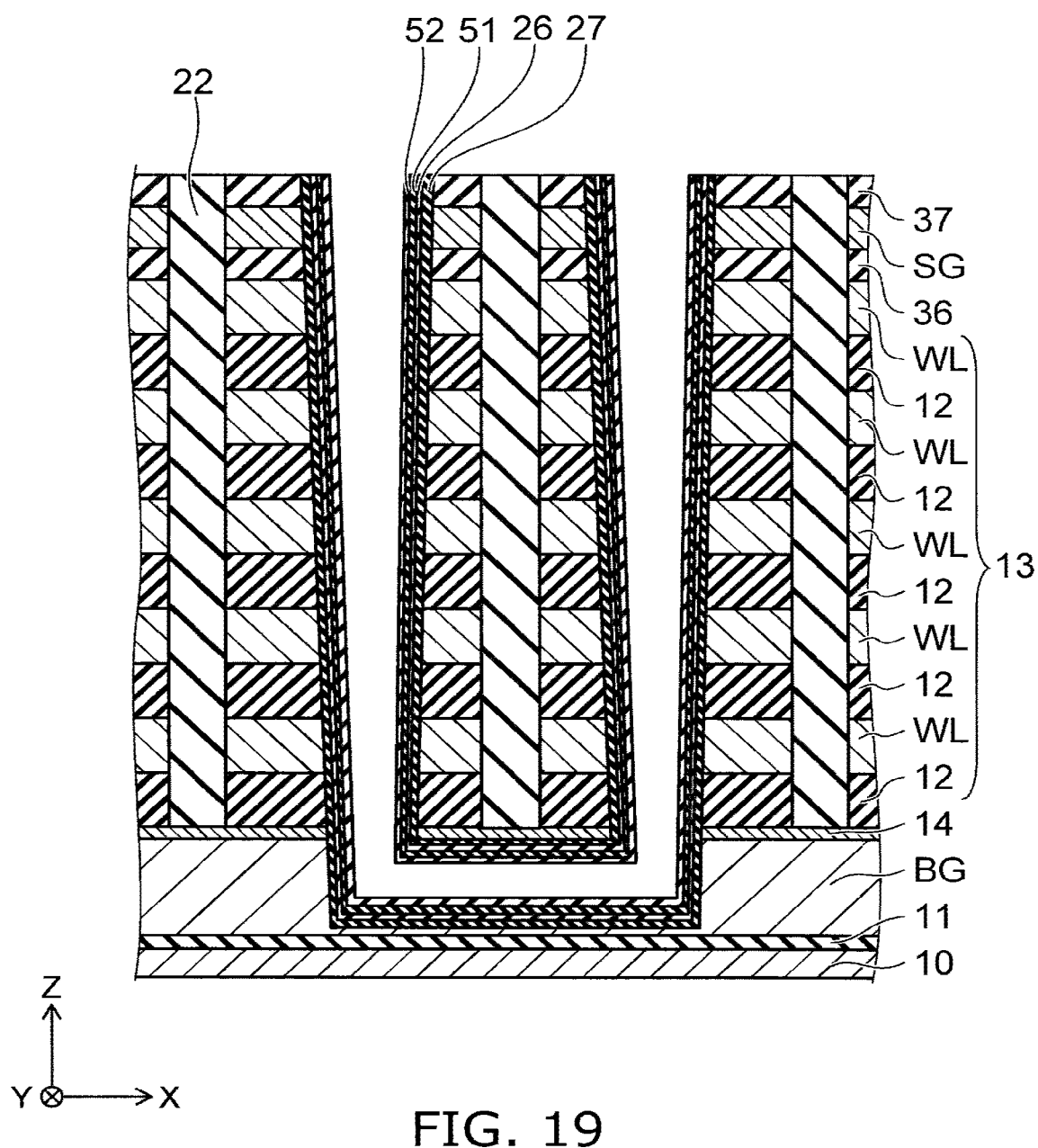
FIGS. 19 and 20 are cross-sectional views illustrating the method for manufacturing the semiconductor memory device according to the second embodiment.
Figure 20:
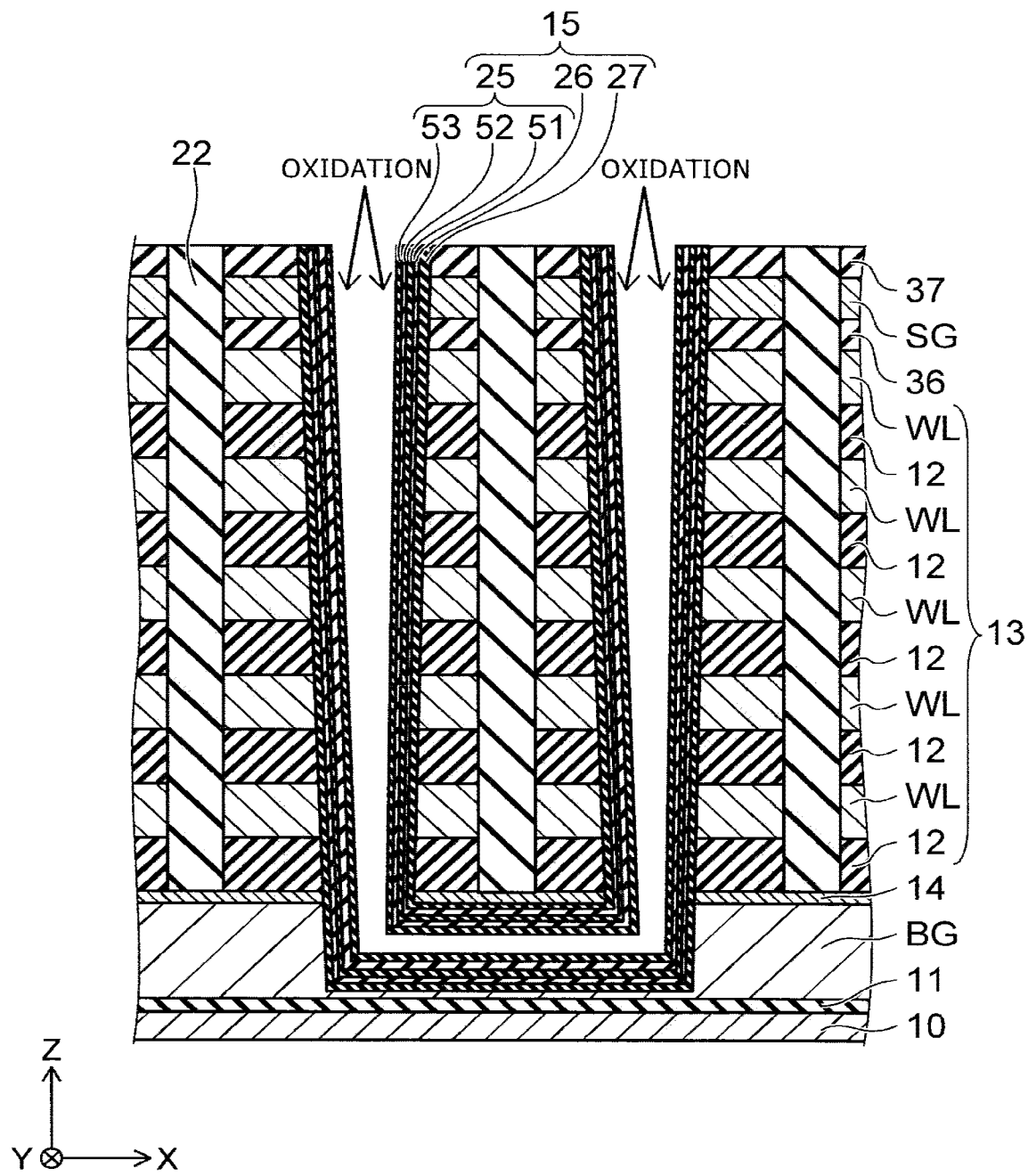

FIGS. 19 and 20 are cross-sectional views illustrating the method for manufacturing the semiconductor memory device according to the embodiment.

First, the method is the same as that according to the first embodiment until the charge storage member 26 is formed inside the memory hole MH.

Next, as illustrated in FIG. 19, for example, the silicon oxide is deposited on the side surface of the charge storage member 26 of which the thickness is 5.0 nm using a CVD method or an ALD method such that the top-oxide member 51 of which the thickness is 3.0 nm is formed. Then, the silicon nitride is deposited on the side surface of the top-oxide member 51 using the same method as that in forming the top-oxide member 51 such that about 3.0 nm of the middle-nitride member 52 is formed.

Next, as illustrated in FIG. 20, for example, the surface of the middle-nitride member 52 is oxidized using a radical oxidation method such that the bottom-oxide member 53 is formed.

At this time, for example, in the uppermost word line WL, the middle-nitride member 52 is oxidized to a depth of about 0.8 nm from the surface and the bottom-oxide member 53 of which the thickness is about 1.6 nm is formed. The final member thickness of the middle-nitride member 52 is about 2.2 nm. In addition, in the lowermost word line WL, the middle-nitride member 52 is oxidized to a depth of about 0.8 nm from the surface and the bottom-oxide member 53 of which the thickness is about 1.8 nm is formed. That is, the smaller the diameter (2×R) of the memory hole MH, the thicker the bottom-oxide member 53. The final member thickness of the middle-nitride member 52 is about 2.2 nm in the lowest word line WL. In this way, the tunnel insulating member 25 is formed to include the top-oxide member 51, the middle-nitride member 52, and the bottom-oxide member 53.

The other manufacturing methods, operations, and effects according to the embodiment are the same as in the first embodiment described above.

Third Embodiment

Next, the third embodiment will be described.

Figure 21:
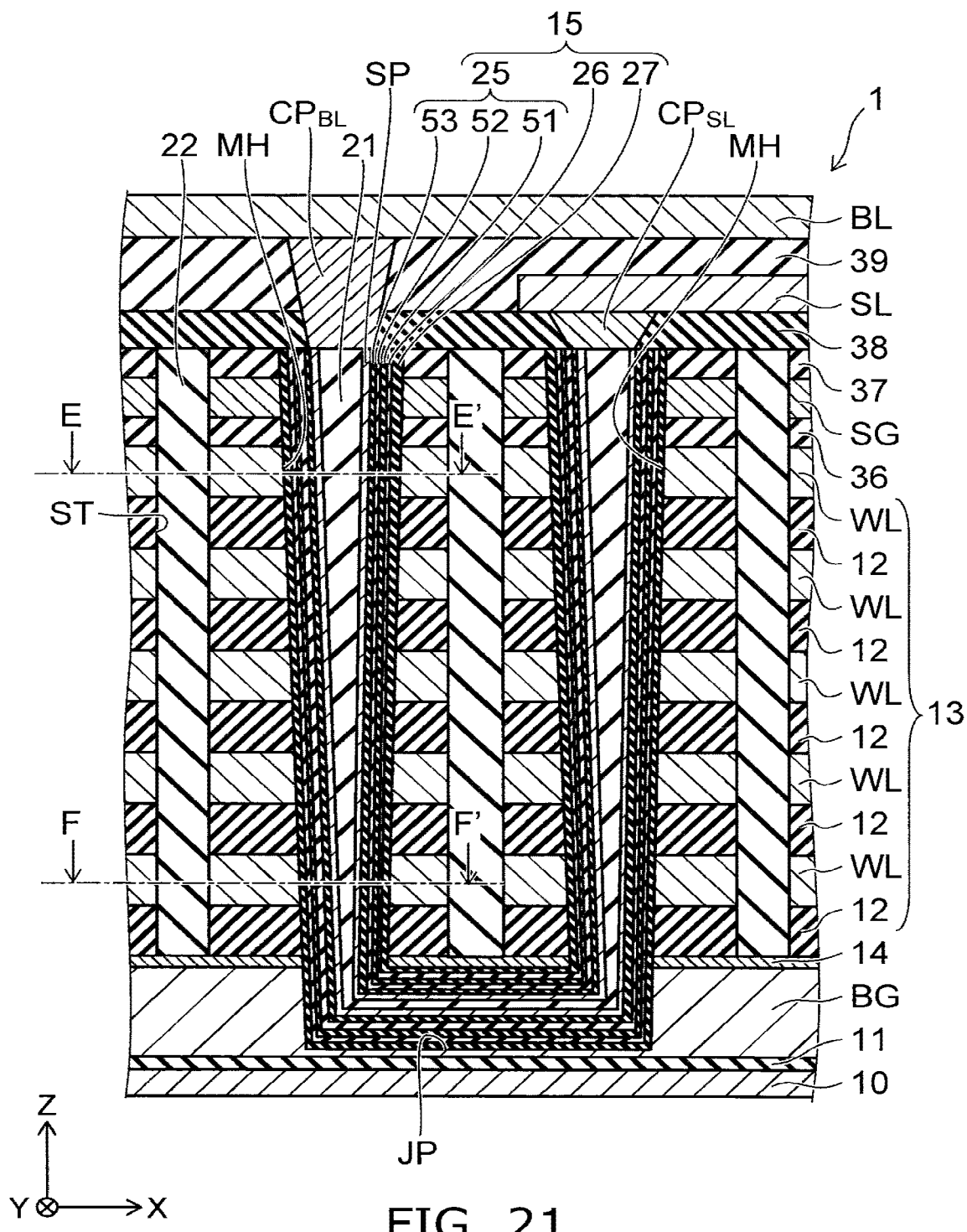
FIG. 21 is a cross-sectional view illustrating the semiconductor memory device according to a third embodiment.

FIG. 21 is a cross-sectional view illustrating the semiconductor memory device according to the embodiment.

Figure 22:
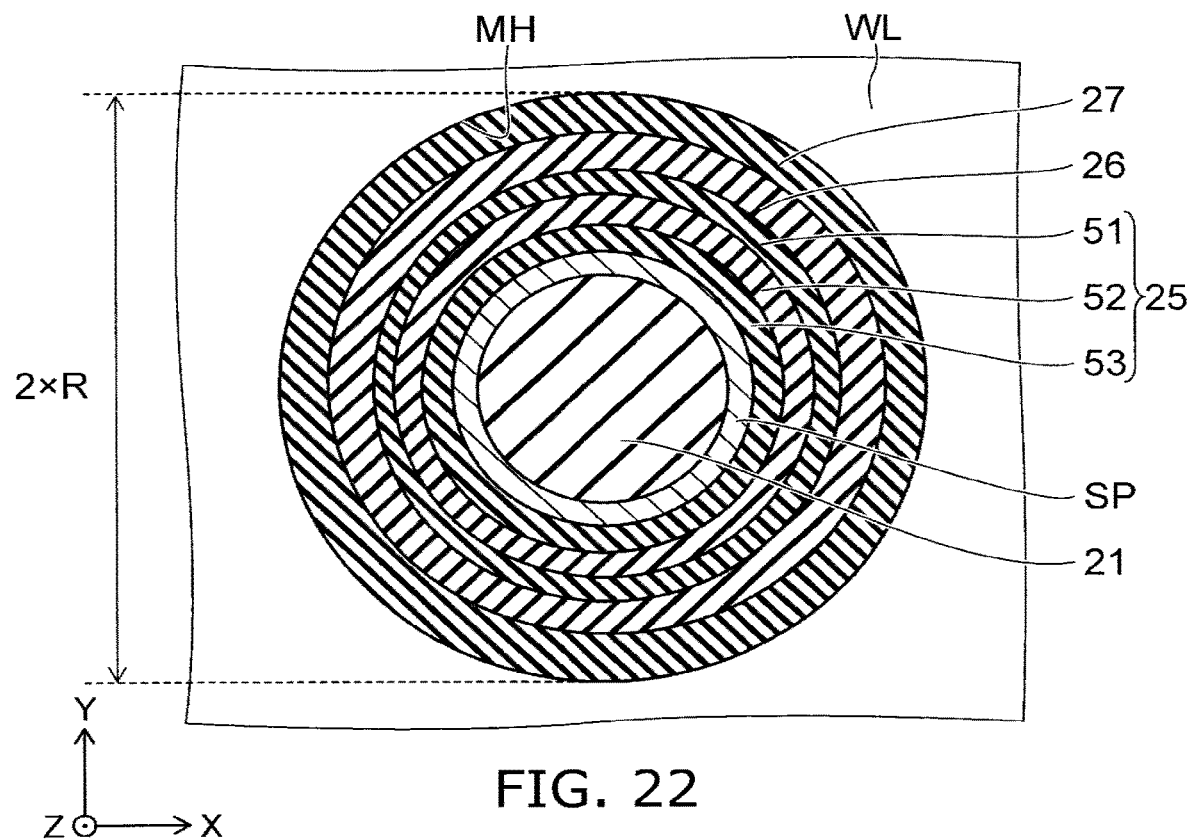
FIG. 22 is a cross-sectional view taken along line XXII-XXII shown in FIG. 21.

FIG. 22 is a cross-sectional view taken along line XXII-XXII shown in FIG. 21.

Figure 23:
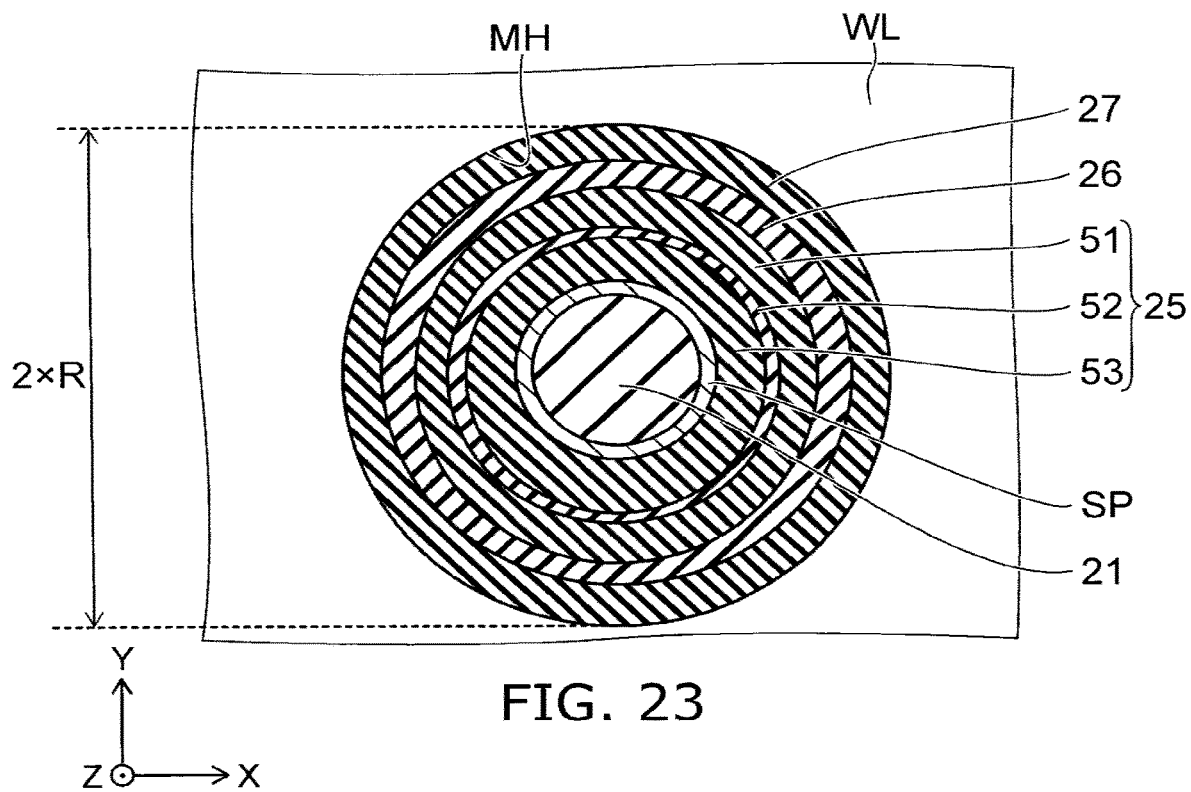
FIG. 23 is a cross-sectional view taken along line XXIII-XXIII shown in FIG. 21.

FIG. 23 is a cross-sectional view taken along line XXIII-XXIII shown in FIG. 21.

First, a configuration of the semiconductor memory device according to the embodiment is described.

As illustrated in FIGS. 22 and 23, the semiconductor memory device 1 according to the embodiment is different compared to the second embodiment in that the thickness of the top-oxide member 51 becomes greater as the diameter (2×R) of the memory hole MH becomes smaller.

For example, in FIG. 22, the thickness of the tunnel insulating member 25 is as follows. The diameter (2×R) of the memory hole MH is about 78 nm, the thickness of the block insulating member 27 is about 10 nm, the thickness of the charge storage member 26 is about 5.0 nm, the thickness of the top-oxide member 51 of the tunnel insulating member 25 is about 3.1 nm, the thickness of the middle-nitride member 52 is about 2.2 nm, the thickness of the bottom-oxide member 53 is about 1.6 nm, and the thickness of the silicon pillar SP is about 3.0 nm.

In addition, In FIG. 23, the thickness of the tunnel insulating member 25 is as follows. In a case where the diameter (2×R) of the memory hole MH is about 52 nm, the thickness of the top-oxide member 51 is about 3.3 nm and the thickness of the bottom-oxide member 53 is about 1.8 nm. The member thicknesses other than the top-oxide member 51 and the bottom-oxide member 53 are the same as those in FIG. 22.

In a case where the diameter of the memory hole MH is about 78 nm, the thickness of the top-oxide member 51 is about 3.1 nm. Meanwhile, in a case where the diameter of the memory hole MH is about 52 nm, the thickness of the top-oxide member 51 is about 3.3 nm, and thus the thickness is greater, compared to the case where the diameter of the memory hole MH is about 78 nm. In addition, in a case where the diameter of the memory hole MH is about 78 nm, the thickness of the bottom-oxide member 53 is about 1.6 nm. Meanwhile, in a case where the diameter of the memory hole MH is about 52 nm, the thickness of the bottom-oxide member 53 is about 1.8 nm, and thus the thickness is greater, compared to the case where the diameter of the memory hole MH is about 78 nm Configurations according to the embodiment which are not described above are the same as those of the second embodiment described above.

Next, the method for manufacturing the semiconductor memory device according to the embodiment will be described.

First, the method is the same as that according to the second embodiment until the charge storage member 26 is formed inside the memory hole MH. Then, using the same method as the method for forming the tunnel insulating member 25 according to the first embodiment, for example, the charge storage member 26 is oxidized using a radical oxidation method and then the formed silicon oxide becomes the top-oxide member 51.

The other manufacturing methods according to the embodiment are the same as in the second embodiment.

Next, effects of the semiconductor memory device according to the embodiment will be described.

In the semiconductor memory device according to the embodiment, the larger the diameter of the memory hole MH, the smaller the member thickness of the top-oxide member 51 as well as the bottom-oxide member 53, and the smaller the diameter of the memory hole MH, the greater the member thickness of the top-oxide member 51 as well as the bottom-oxide member 53. Therefore, it is possible to further widen the threshold window W.

The other operations and effects according to the embodiment are the same as in the second embodiment described above.

According to the first embodiment to the third embodiment which are described above, the middle-nitride member 52 may not be a perfect nitride member, but may be a silicon oxynitride member containing oxygen.

In addition, an example of the diameter of the memory hole MH is described, in which the diameter is larger in the upper section and the lower the section, the smaller the diameter; however, the configuration is not limited thereto. For example, a bowing phenomenon is caused to occur during the formation of the memory hole MH and the memory hole MH may have a bowed shape in which the memory hole MH has the greatest diameter in the middle.

Further, the configuration in which the silicon pillar SP is U-shaped is described; however, the silicon pillar SP may be a straight type in which the source line is disposed on the lower section.

Further, an example of the method for manufacturing the semiconductor memory device is described, in which, after the interlayer insulating members 12 and the word lines WL are stacked alternately, the memory hole MH is formed, and then the memory member 15 and the silicon pillar SP are formed; however, the method is not limited thereto. For example, the stacked body may be formed by the following processes. The interlayer insulating members 12 and the sacrificial members are stacked alternately such that the stacked body is formed. The memory hole MH is formed inside the stacked body. After the charge storage member is formed in the memory hole MH, the tunnel insulating member is formed through the same processes according to the first to third embodiments described above. A groove that extends in the Z-direction in the stacked body is formed and then the sacrificial member is removed through the groove. The block insulating member and the electrode member are deposited in this order at the position from which the sacrificial member is removed. It is possible to achieve the same effects as in the embodiments even when the semiconductor memory device is formed using these processes.

According to the embodiments described above, the larger the diameter of the memory hole, the smaller the member thickness of the tunnel insulating member. In addition, the smaller the diameter of the memory hole, the greater the member thickness of the tunnel insulating member. As a result, it is possible to provide a semiconductor memory device that includes a wide threshold window, and the method for manufacturing the semiconductor memory device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a semiconductor memory device comprising:
   forming a first electrode member on a flat surface perpendicular to a first direction,
   forming a second electrode member parallel to the first electrode member, the second electrode member being disposed above the first electrode member,
   forming a memory hole that penetrates the first electrode member and the second electrode member in the first direction from above, a diameter of the memory hole at a position of the first electrode member being made smaller than a diameter of the memory hole at a position of the second electrode member, forming a first charge storage portion on a side surface of the first electrode member via an insulating material and a second charge storage portion on a side surface of the second electrode member via the insulating material, forming a first insulating member and a second insulating member by oxidizing the first charge storage portion and the second charge storage portion, a thickness of the first insulating member being made larger than a thickness of the second insulating member, and forming a semiconductor layer at an inner side of the first insulating member and the second insulating member.

2. The method according to claim 1, wherein the oxidation includes radical oxidation, thermal oxidation, or plasma oxidation.

3. The method according to claim 1, wherein the first insulating member and the second insulating member contain silicon oxide.

4. The method according to claim 1, wherein the first insulating member and the second insulating member contain silicon oxynitride.

5. The method according to claim 1, further comprising:
forming a fourth insulating member on a side surface of the first insulating member and the second insulating member.

6. The method according to claim 5, wherein the fourth insulating member contains silicon oxide.

7. The method according to claim 6, further comprising:
forming a fifth insulating member on a side surface of the first insulating member and the second insulating member before the forming the fourth insulating member.

\* \* \* \* \*